United States Patent
Horie et al.

(10) Patent No.: US 6,323,052 B1
(45) Date of Patent: Nov. 27, 2001

(54) COMPOUND SEMICONDUCTOR LIGHT EMITTING DEVICE AND METHOD OF FABRICATING THE SAME

(75) Inventors: Hideyoshi Horie; Hirotaka Ohta; Toshinari Fujimori, all of Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/095,884

(22) Filed: Jun. 11, 1998

(30) Foreign Application Priority Data

| | | |
|---|---|---|
| Aug. 13, 1997 | (JP) | 9-218545 |
| Aug. 13, 1997 | (JP) | 9-218546 |
| Oct. 29, 1997 | (JP) | 9-296863 |
| Dec. 11, 1997 | (JP) | 9-341193 |

(51) Int. Cl.$^7$ .................................................. H01L 21/00
(52) U.S. Cl. ................... 438/46; 438/22; 438/29; 438/38; 438/46; 438/47; 438/473; 438/474
(58) Field of Search ................... 438/22, 29, 38, 438/46, 47, 473, 474

(56) References Cited

U.S. PATENT DOCUMENTS

| | | |
|---|---|---|
| 4,563,368 | 1/1986 | Tihanyl et al. . |
| 5,063,173 | 11/1991 | Gasser et al. . |
| 5,089,437 | 2/1992 | Shima et al. . |
| 5,144,634 | 9/1992 | Gasser et al. . |
| 5,161,166 | 11/1992 | Shima et al. . |
| 5,171,717 | 12/1992 | Broom et al. . |
| 5,469,457 | 11/1995 | Nagai et al. . |
| 5,545,484 | * 8/1996 | Yamaguchi et al. .................. 428/408 |
| 6,057,557 | * 5/2000 | Ichikawa ................................ 257/59 |

FOREIGN PATENT DOCUMENTS

| | | |
|---|---|---|
| 2-45992 | 2/1990 | (JP) . |
| 04336426 | * 11/1992 | (JP) . |

OTHER PUBLICATIONS

"In–vacuum cleaving and coating of semiconductor laser facets using thin silicon and a dieletric", by L.W. Tu et al., *J. Appl. Phys.*, 80 (11), (Dec. 1, 1996) pp. 6448–6451.

\* cited by examiner

*Primary Examiner*—Long Pham
(74) *Attorney, Agent, or Firm*—Armstrong, Westerman, Hattori, McLeland & Naughton, LLP

(57) ABSTRACT

Compound semiconductor light emitting devices capable of suppressing the surface state density on the facets of semiconductor light emitting devices such as semiconductor lasers for a long time and stable operating even when the passivation layer diffuses can be easily obtained. Compound semiconductor light emitting devices with an emission wavelength of λ (nm) wherein a first conduction type of clad layer, an active layer and a second conduction type of clad layer are grown on a substrate and two facets are opposite to each other so as to form a cavity, characterized in that said active layer is transparent to the emission wavelength in the vicinities of the facets and that the surfaces of the first conduction type of clad layer, active layer and second conduction type of clad layer forming said facets are each coated with a passivation layer.

17 Claims, 14 Drawing Sheets

COMPOUND SEMICONDUCTOR LIGHT EMITTING DEVICE AND METHOD OF FABRICATING THE SAME

BACKGROUND OF THE INVENTION

1. Field of the Invention

This invention relates to semiconductor light emitting device and a method of fabricating the same, in particular, a process for producing semiconductor lasers. The device and the process according to the present invention are usable appropriately in semiconductor lasers which should have high light output power and high reliability, for example, excitation light sources for optical fiber amplifier and light sources for optical data storage system. Moreover, the device and the process of the present invention are applicable to LID of super-luminescent diodes, etc. wherein the facet of the light emitting device serves the light emission vertical cavity surface emitting lasers, etc.

2. Description of the Related Art

In recent years, optical data processing technology and optical communication technology have achieved brilliant extraordinary results exemplified by high-density recording with the use of optical magnetic discs and two way communication with optical fiber networks.

In the communication technology, for example, studies have been energetically made in various fields to develop large-capacity optical fiber transmitters usable in the coming multimedia age as well as $Er^{3+}$-doped optical fiber amplifiers (EDFA) as signal amplifiers flexibly applicable to these transmission systems. Under these circumstances, it has been required to develop semiconductor lasers with high output power and high reliability which are essentially required as a component of EDFA.

The emission wavelengths usable in EDFA theoretically include the following three wavelengths, i.e., 800 nm, 980 nm and 1480 nm. By taking the characteristics of amplifiers into consideration, it is known that excitation at 980 nm, among all, is most desirable from the viewpoints of amplifier efficiency, noise figure, etc. It is needed that lasers with the emission wavelength of 980 nm have two contrary characteristics of high output and high reliability. Moreover, there are demands for lasers with wavelength in the vicinities thereof (for example, 890–1150 nm) as light source of secondary harmonic generation (SHG) and a source of thermal laser printers. In addition thereto, it has been urgently required to develop highly reliable lasers with high output in various fields.

In the field of data processing, attempts have been made to increase the output and shorten the wavelength of semiconductor lasers to achieve high-density recording and rapid writing and reading. That is to may, it has been strongly required to increase the output of laser diodes (hereinafter referred to simply as LDs) with the conventional emission wavelength of 780 nm and studies have been energetically Made to develop LDs of 630 to 680 nm.

To achieve both of high output and high reliability which are essentially required in these lasers, there have been proposed a number of methods, for example, one comprising making the band gap in the active layer region around the facets so as to suppress the light absorption in the vicinities of the facets. Lasers with these structures, which are generally called window-structure lasers or non absorbing mirror (NAM) structure lasers, are highly effective in establishing high output laser diodes.

On the other hand, JP-A-3-101183 (the term "JP-A" as used herein means an "unexamined published Japanese patent application") proposes another method for solving the above problem. According to this patent, it is effective to form a contamination-free facet and then form a passivation layer or a part of the same with the use of a material which undergoes neither any reaction with the semiconductor facet nor diffusion per se and contains no oxygen.

As known reference similar to the above patent JP-A-3-101183, citation may be made of L. W. Tu et al, In-vacuum cleaving and coating of semiconductor laser facets using Si and a dielectric, J. Appl. Phys. 80 (11) Dec. 1, 1996. According to this paper, when cleavage is performed in vacuum in the step of coating laser facets with an $Si/AlO_x$ structure, the carrier recombination in the cleaved facet is retarded and thus the initial catastrophic optical damage (COD) level is increased.

Further, there has been known a technique for inserting an Si layer having an optical thickness corresponding to ¼ of the emission wavelength between a coating film and each semiconductor layer so as to displace the facets from the anti-node of the standing wave in the direction of the cavity, thus lowering the electric field strength at the beam emission facet.

For example, there have been already developed semiconductor lasers of 980 nm or therearound and withstanding continuous use for about 2 years at light output of 50 to 100 mW and a process for producing the same. When operated at higher light outputs, however, these lasers are rapidly degraded, thus showing poor reliability. The same applies to LDs of 780 nm or 630–680 nm. Thus, it is the problem which now confronts all semiconductor lasers, in particular, those with the due of GaAs substrates to ensure a high reliability at higher output.

One of the reasons therefore resides in the degradation of the diode facet exposed to extremely high light output density. As well known regarding GaAs/AlGaAs Semiconductor lasers, there are a number of surface states (gap state) in the vicinities of facet. Since these states absorb the output light, the temperature in the vicinities of the facets in generally higher than the temperature at bulk of the laser. This increase in temperature further narrows the band gap in tho vicinities of the facets and then the output light can be more easily absorbed, thus causing a positive feedback. This phenomenon is known as so-called COD observed when a large current is injected instantly. On the other hand, there arises a problem, in common to a number of semiconductor laser elements, of the sudden failure associating a decrease in the COD level after long time driving. Although attempts have been vigorously made to solve those problems as described above, the technical level at the present stage is insufficient.

An LD with the window-structure can be produced by, for example, epitaxially growing a semiconductor material transparent to the emission wavelength on the laser facets. In this method, the epitaxial growth is performed on the facets while making the laser in the so-called bar state, which makes the subsequent electrode step highly troublesome.

Furthermore, there are various methods which comprise intentionally thermal-diffusing or ion-implanting Zn, Si, etc. as impurities into an active layer in the vicinities of laser facets so as to disorder the above-mentioned active layer, as proposed by JP-A-2-45992, JP-A-3-31083 and JP-A-6-302906.

During the production of an LD, impurities generally diffuse in the epitaxial growth direction of the laser element toward the substrate. Accordingly, there arise problems in controlling the diffusion depth and controlling the horizontal diffusion to the cavity direction, which makes stable production difficult.

When ion-implantation is carried out, ions with high energy are introduced from the facets. As a result, damages frequently remain on the LD facets even after annealing, Moreover, there arise another problem that an increase in the reactive current accompanying the decrease in the resistance in the region into which impurities have been introduced would increase the threshold current and driving current, On the other hand, the process disclosed in JP-A-3-101183 as cited above, which comprises forming a contamination-free facet and then forming a passivation layer or a part of the same with the use of a material which undergoes neither any reaction with the semiconductor facet nor diffusion per se and contains no oxygen, suffers from technical problems as will be described below.

It is generally impossible to prevent the formation of non-reactive recombination centers such as Ga-O and As-O on the facet at cleavage by performing the operation in the atmosphere in, for example, a clean room. From this point of view, it is essentially required to form a passivation layer in situ at the point of cleaving for the "method of forming a contamination-free facet" as disclosed in claim 1 in the gazette of this patent. To embody this method in practice, the cleavage should be carried out in vacuum as stated in claim 10 in the gazette. For an effect cleavage in vacuum, an extremely complicated procedure and troublesome labor are required in general, compared with the case where cleavage is effected in the atmosphere. Many non-reactive recombination centers are formed on facets formed by dry-etching as stated in claims 11 to 14 in the gazette, compared with facets formed by cleavage. Thus, this dry etching procedure is unsuitable for the production of LDs which should have high reliability.

The optimum examples of the passivation layer are Si (single crystal or polycrystal Si) and amorphous Si. However, there is no substance never undergoing diffusion in general. In semiconductor lasers which are to be operated at high output and high temperature for a long time, in particular, it is feared that the passivation materials disclosed in the above patent might diffuse.

Although it is described in L. W. Tu et al., In-vacuum cleavage and coating of semiconductor laser facets using Si and a dielectric, J. Appl. Phys. 80 (11) Dec. 1, 1996 as cited above that when an $Si/AlO_x$ structure in cleaved in vacuum in the step of coating onto a laser facet, the carrier recombination on the cleaved facet is retarded and thus the initial COD level is increased. However, this reference reforms to neither reliability over a long time nor the relationship between coating and the LD structure.

Further, there has been known a technique for inserting an Si layer having an optical thickness corresponding to ¼ of the emission wavelength of between a coating film and each semiconductor layer so as to displace the facets from the anti-node of the standing wave in the direction of the cavity, thus lowering the electric field strength at the beam emission facet, However, this technique suffers from a fear that Si per se would serve as a light absorption in the emission wavelength region embodied by usual semiconductor lasers, in particular within the range of from 400 to 1600 nm needed for high output LDs and thus there is a possibility that the degradation of devices might be accelerated by an increase in temperature on facets.

SUMMARY OF THE INVENTION

An object of the present invention, which has been completed to solve the above problems, is to provide semiconductor lasers capable of suppressing the surface state density on the facets of semiconductor light emitting devices such as semiconductor lasers for a long time and stable operating even when the passivation layer diffuses, and a process for conveniently producing the same. In other words, the present invention provides high-performance semiconductor lasers establishing both of high output and high reliability by preventing degradation on facets.

The present inventors have found out that semiconductor light emitting devices having compound semiconductor layers containing at least a first conduction type of clad layer, an active layer transparent to the emission wavelength in the vicinities of the facets and a second conduction type of clad layer forced on a substrate and having cavity facets coated with passivation layers are much superior in high output and high reliability to the conventional ones, thus completing the present invention.

Accordingly, the gist of the present invention resides in a compound semiconductor light emitting device having a compound semiconductor layer containing at least a first conduction type of clad layer, an active layer and a second conduction type of clad layer formed on a substrate and having cavity facets, characterized in that the active layer is transparent to the emission wavelength in the vicinities of the facets, preferably free from oxide, and that the facets are coated with a passivation layer.

The present inventors have also found out that semiconductor light emitting devices having a p-type active layer preferably containing In and having a cavity facet coated with a passivation layer containing Si, more preferably having disordered cavity facet free from oxide are much superior in high output and high reliability.

Accordingly, the gist of the present invention resides in compound semiconductor light emitting devices wherein a first conduction type of clad layer, an active layer and a second conduction type of clad layer are grown on a substrate and two facets opposite to each other form a cavity, characterized in that said conduction type of active layer in P and that the surfaces of the first conduction type of clad layer, active layer and second conduction type of clad layer forming said facets are each coated with a passivation layer containing Si.

The present inventors have further conducted extensive studies to solve the above-mentioned problem. As a result, they have found out that when said facets are treated by irradiating with plasma having energy falling within an optimized range from the facet side, the facets can be easily made transparent without any problems (for example, control of the diffusion depth and the horizontal diffusion to the cavity as observed in the case where impurities are diffused; difficulties in the electrode formation as observed in the case where epitaxial growth is performed on the facets; passage of reactive current accompanying the decrease in the resistance in the vicinities of the facets), thus giving semiconductor lasers achieving both of high output and high reliability. The present invention has been completed on the basis of this finding.

Accordingly, the gist of the present invention resides in a process for producing a semiconductor laser having a first conduction type of clad layer, an active layer and a second conduction type of clad layer formed on a semiconductor substrate, characterized in that at least one facet forming a cavity is irradiated with plasma having energy of from 25 eV to 300 eV.

The present inventors have further conducted extensive studies to solve the above-mentioned problem. As a result, they have found out that semiconductor light emitting devices produced by a process for producing a semiconductor light emitting device having a compound semiconductor layer containing at least a first conduction type of clad layer, an active layer and a second conduction type of clad layer formed on a substrate and having a cavity, which comprises forming the compound semiconductor layer on the substrate by crystal growth; next forming the cavity facets; then desorping a part of the elements constituting at least the active layer in the vicinities of the facets exposed on at least one of the facets via irradiation with ion, electron, heat and/or light, etc. to thereby form a region transparent to the emission wavelength in the vicinities of the semiconductor light emitting device; and forming a passivation layer in vacuum; are much superior both in high output and high reliability to the conventional ones, though the production process is highly convenient, thus completing the present invention.

Accordingly, the gist of the present invention resides in a process for producing a semiconductor light emitting device having a first conduction type of clad layer, an active layer and a second conduction type of clad layer formed on a substrate and having a cavity, characterized by comprising forming the compound semiconductor layer on the substrate by crystal growth; next forming the cavity facets; then desorption of a part of the elements constituting at least the active layer in the vicinities of the facets exposed on at least one of the facets; and forming a passivation layer in vacuum.

The present inventors have further conducted extensive studies to solve the above-mentioned problem. As a result, they have found out that, in a semiconductor laser having a first conduction type of clad layer, an active layer containing quantum well and a second conduction type of clad layer on a semiconductor substrate, elements with high vapor pressure in the vicinities of the facets can be selectively desorbed by irradiating ion, electron, light and/or heat in vacuum to at least one facet forming the cavity. Thus a region having a band gap exceeding the effective band gap of the materials constituting the active layer in formed in the vicinities of the facet. That is to say, the region is made transparent to the emission wavelength of the semiconductor laser. Thus, high-performance semiconductor layers with the window-structure capable of achieving both high output and high reliability can be easily obtained without suffering from the above problems encountering in the prior art. The present invention has been thus completed.

Accordingly, the gist of the present invention resides in a semiconductor laser having a first conduction type of clad layer, an active layer containing quantum well and a second conduction type of clad layer formed on a semiconductor substrate, characterized in that the active layer is made transparent to the emission wavelength by desorping a part of the constituting elements in the vicinities of at least one facet forming the cavity.

Another gist of the present invention resides in a process for producing a semiconductor laser having a first conduction type of clad layer, an active layer containing quantum well and a second conduction type of clad layer formed on semiconductor substrate, characterized by comprising forming the first conduction type of clad layer, active layer containing quantum well and second conduction type of clad layer on the semiconductor substrate; and selectively desorping element with high vapor pressure by irradiating in vacuum at least one facet forming the cavity with ion, electron, light and/or heat beam to thereby form a region which has been made transparent to the emission wavelength in the vicinities of the facet of the active layer.

The present inventors have further conducted extensive studies to solve the above-mentioned problem. As a result, they have found out that a compound semiconductor light emitting device having at least a first conduction type of clad layer, an active layer and a second conduction type of clad layer grown on a substrate, two facets which are opposite to each other forming a cavity and having an emission wavelength of $\lambda$ (nm), characterized in that the surfaces of the first conduction type of clad layer, active layer and second conduction type of clad layer forming the transparent facets are coated with passivation layers, and the surfaces of the passivation layers are coated with a coating layer comprising a dielectric material optionally combined with a semiconductor, is much superior in high output and high reliability to the conventional ones, thus completing the present invention.

Accordingly, the gist of the present invention resides in a compound semiconductor light emitting device having at least a first conduction type of clad layer, an active layer and a second conduction type of clad layer grown on a substrate, two facets which are opposite to each other forming a cavity and having an emission wavelength of $\lambda$ (nm), characterized in that the surfaces of the first conduction type of clad layer, active layer and second conduction type of clad layer forming the facets are coated with passivation layers made of Si, and the surfaces of the passivation layers are coated with a coating layer comprising a dielectric material optionally combined with a semiconductor.

A first aspect of the device is a compound semiconductor light emitting device of present invention, which comprises
  a first conduction type of clad layer;
  an active layer; and
  a second conduction type of clad layer grown on a substrate and
  two facets of said first conduction typo of clad layer; said active layer; and said second conduction typo of clad layer, being opposite to each other so as to form a cavity,
    wherein said active layer in transparent to the emission wavelength in the vicinities of the facets and the surfaces of the first conduction type of clad layer, active layer and second conduction type of clad layer forming said facets are each coated with a passivation layer.

A second aspect of the device is a compound semiconductor light emitting device according to the first aspect, wherein at least one of the constituting elements of the surfaces of the first conduction type of clad layer, active layer and second conduction type of clad layer forming said facets exists in the form free from an oxide.

A third aspect of the device is a compound semiconductor light emitting device according to the first aspect, wherein the vicinities of said facets have been disordered.

A fourth aspect of the device is a compound semiconductor light emitting device according to the first aspect, wherein a coating layer comprising a dielectric material optionally combined with a semiconductor material in formed on the surface of said passivation layer.

A fifth aspect of the device is a compound semiconductor light emitting device according to the first aspect, wherein said passivation layer contains Si.

A sixth aspect of the device is a compound semiconductor light emitting device according to the first aspect, wherein one of said facets is coated with an anti-reflective coating layer containing an $AlO_x$ layer while the other is coated with a high-reflective coating layer containing $AlO_x$ layer and Si layer.

A seventh aspect of the device is a compound semiconductor light emitting device according to the first aspect, wherein said active layer comprises a compound semiconductor layer containing In.

An eighth aspect of the device is a compound semiconductor light emitting device of the present invention, which comprises:
   a first conduction type of clad layer; an active layer; and a second conduction typo of clad layer, grown on a substrate and
   two facets of said first conduction type of clad layer; said active layer; and said second conduction type of clad layer, being opposite to each other so as to form a cavity,
      wherein a conduction type of said active layer is p type and the surfaces of the first conduction type of clad layer, active layer and second conduction type of clad layer forming said facets are coated with a passivation layer containing Si.

A ninth aspect of the device is a compound semiconductor light emitting device according to the eighth aspect, wherein at least one of the constituting elements of the surfaces of the first conduction type of clad layer, active layer and second conduction type of clad layer forming said facets exists in the form free from an oxide.

A tenth aspect of the device is a compound semiconductor light emitting device according to the eighth aspect, wherein the vicinities of the facets of the cavity have been disordered.

A eleventh aspect of the device is a compound semiconductor light emitting device according to the eighth aspect, wherein said active layer comprises a compound semiconductor layer containing In.

A twelfth aspect of the method is a method of fabricating a compound semiconductor light emitting device of the present invention, which comprises the steps of:
   growing a first conduction type of clad layer, an active layer and a second conduction type of clad layer on a substrate;
   forming facets of a cavity; and
   irradiating said facets of the cavity with plasma having energy of from 25 eV to 300 eV in vacuum, A thirteenth aspect of the method is a method of fabricating a compound semiconductor light emitting device according to the twelfth aspect, wherein said step of forming facets of a cavity comprises a cleavage of the first conduction type of clad layer, the active layer and the second conduction type of clad layer 80 that two facets are opposite to each other to form the cavity.

A fourteenth aspect of the method is a method of fabricating a compound semiconductor light emitting device according to the twelfth aspect, wherein plasma of an element of the group 18 is used in said irradiating step.

A fifteenth aspect or the method is a method of fabricating a compound semiconductor light emitting device according to the twelfth aspect, which further comprises a stop of:
   forming a passivation layer on each facet after said plasma irradiation step.

A sixteenth aspect of the method is a method of fabricating a compound semiconductor light emitting device according to the twelfth aspect, which further comprises a step of:
   forming an anti-reflective coating and/or a high-reflective coating on said facets while evacuating continuously after the irradiating step.

A seventeenth aspect of the method is a method of fabricating a compound semiconductor light emitting device of the present invention, which comprises the steps of:
   growing a first conduction type of clad layer, an active layer and a second conduction type of clad layer on a substrate;
   forming facets of a cavity by cleavage of the first conduction type of clad layer, the active layer and the second conduction type of clad layer so that two facets are opposite to each other so as to form a cavity;
   removing, from said facets, a part of elements constituting he facets; and
   forming a passivation layer on each facet after said removing step.

An eighteenth aspect of the method is a method of fabricating a compound semiconductor light emitting device according to the seventeenth aspect, wherein said removing stop comprises a stop of irradiating Paid facets with at least one selected from the group consisting of ion, electron, light and heat in vacuum.

A nineteenth aspect of the method is a method of fabricating a compound semiconductor light emitting device according to the seventeenth aspect, wherein plasma having energy of from 25 eV to 300 eV is used in said irradiating step.

A twentieth aspect of the method is a method of fabricating a compound semiconductor light emitting device according to the t seventeenth aspect, wherein plasma of an element of the group 18 is used in said irradiating step.

A twenty-first aspect of the method is a method of fabricating a compound semiconductor light emitting device according to the seventeenth aspect, which further comprises a step of forming, on said passivation layer, a coating layer containing at least one material selected from the group consisting of dielectrics and combinations of dielectrics and semiconductors.

A twenty-second aspect of the method is a method of fabricating a compound semiconductor light emitting device according to the seventeenth aspect, wherein said passivation layer contains Si.

A twenty-third aspect of the method is a method of fabricating a compound semiconductor light emitting device according to the twenty-first aspect, wherein, at the formation of said coating layer, the surface is irradiated with plasma simultaneously with the formation of the coating layer.

PREFERRED EMBODIMENTS OF THE INVENTION

Next, the present invention will be described in greater detail.

Figure 1:
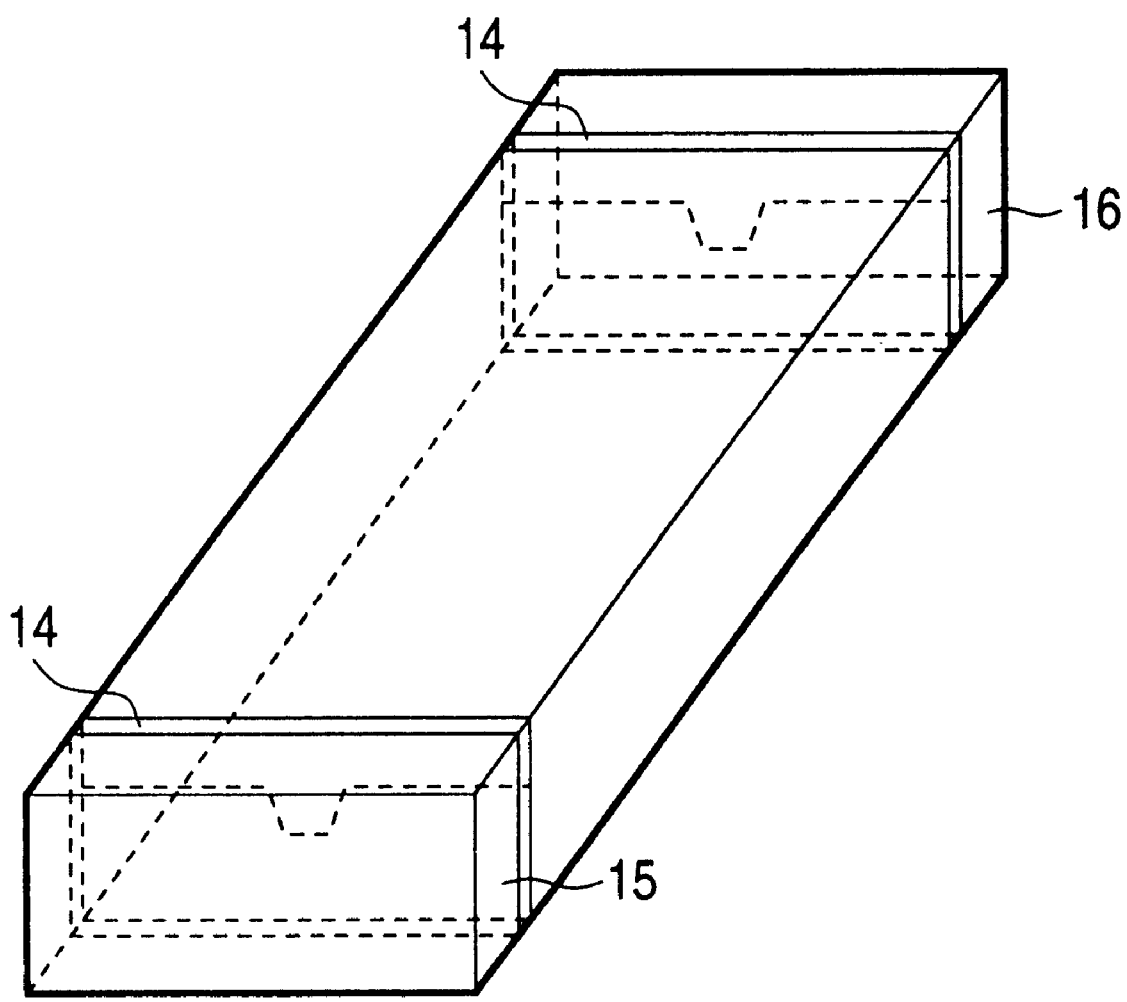
FIG. 1 is a perspective view of the semiconductor light emitting device of the first example of the present invention.

The structure of the semiconductor light emitting device of the present invention is not particularly restricted, so long as it is a compound semiconductor light emitting device wherein, as shown in FIG. 1, at least a first conduction type of clad layer, an active layer and a second conduction type of clad layer are grown on a substrate and two facets being opposite to each other form a cavity, characterized in that said active layer in the vicinities of the facets is transparent to the mission wavelength, and the surfaces of the first conduction type of clad layer, active layer and second conduction type of clad layer forming said facets are coated with a passivation layer 4. Now, explanation will be made by using, as an example, a semiconductor laser of the refractive index guided structure wherein the second conduction type of clad layer consists of the first and second layers and the later (i.e., second) second conduction type of clad layer and current block layers together for a current injection region, and the contact resistance with electrode is lowered by a contact layer.

The basic epitaxial structure of such lasers is exemplified by one described in JP-A-8-130344 (Horie, et al.) in which two etching stop layers are formed on the substrate in contact with a layer comprising at least $Al_xGa_{1-x}$ and ridges or grooves are formed by wet etching. These lasers are used as light sources in optical fiber amplifiers for optical communication light sources for pick-up in large-capacity magnet-optical memory for data processing. Furthermore, these lasers are applicable to various uses by varying the constitution of the active layers and clad layers, using various materials, etc.

Figure 2:
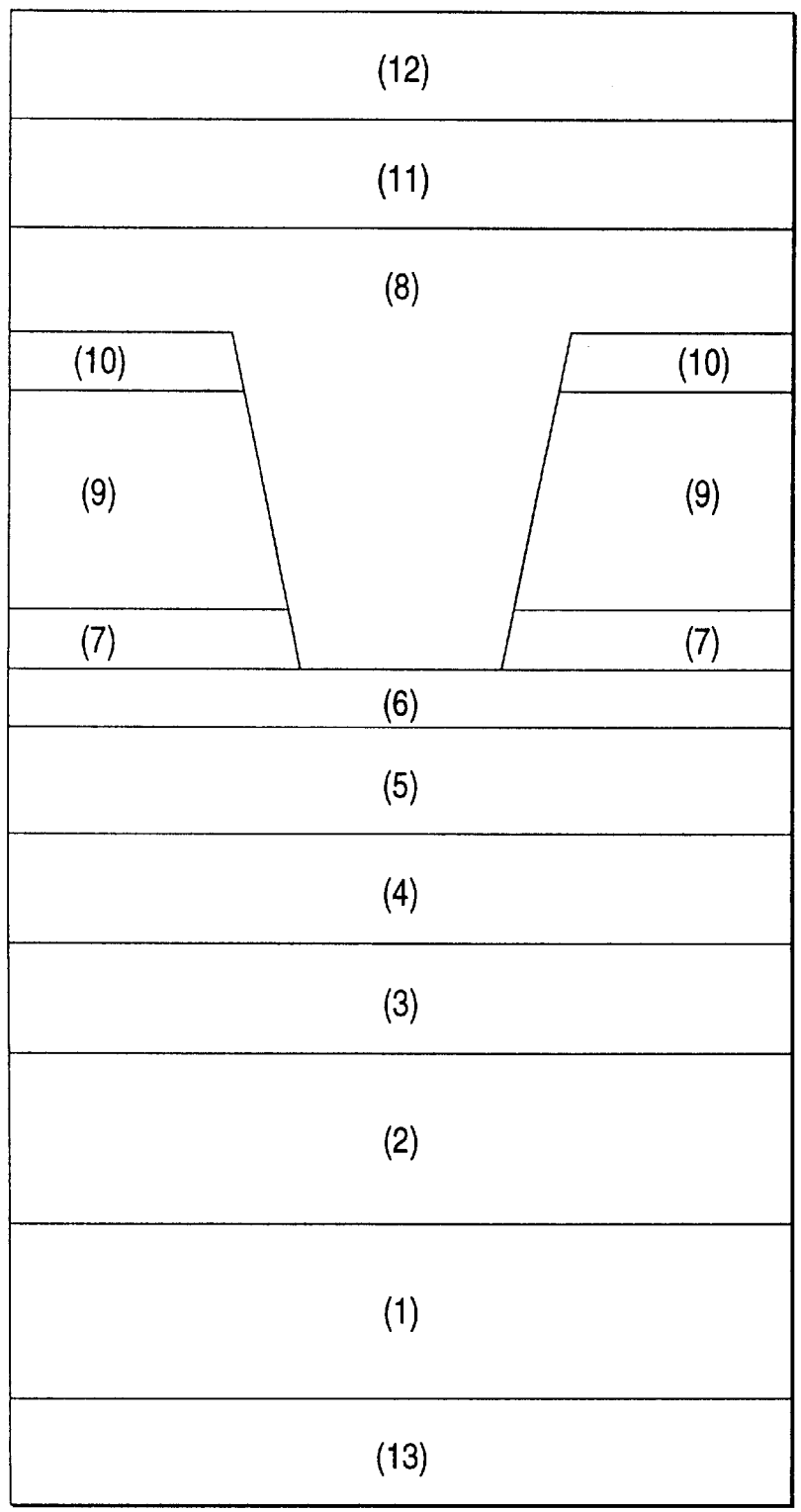
FIG. 2 is a sectional illustration viewing from the cavity facet of the semiconductor laser of the example of the present invention.

FIG. 2 is a model view of the epitaxial structure of a groove type semiconductor laser of the present invention.

By taking the desired emission wavelength, lattice matching, strain intentionally introduced into the active layer, etc., into consideration, use is made as the substrate (1) of a single crystal substrates of InP, GaAs, GaN, InGaAs, $Al_2O_3$, etc. Some dielectric substrates such as those made of $Al_2O_3$ are also usable in some cases. In the embodiments of the present invention, it is preferable to use an InP substrate or a GaAs substrate from the viewpoint of the lattice matching with III-V group compound semiconductor light emitting devices containing As, P, etc. When As is contained as an element of the V group, it is most desirable to use a GaAs substrate.

Dielectric substrates such as those made of $Al_2O_3$ are sometimes employed for the growth of materials containing nitrogen as an element of the V group in III-V group semiconductor light emitting devices.

Use can be made of not only so-called just substrates (oriented substrates, for example, (100) substrate)but also so-called off-angle substrates (miss oriented substrates, for example 2° off from (100) surface) so as to improve the crystallinity in the epitaxial growth. Because of having an effect of promoting good crystal growth in the so-called step flow mode, these off-angle substrates are employed widely. Although off-angle substrates are usually inclined by 0.5 to 2°, those inclined around 10° are used in some material systems constituting the quantum well structure, The substrates are sometimes subjected to chemical etching, heat treatment, etc., as a pretreatment for the production of light emitting devices with tho use of the crystal growing techniques such as MBE (Molecular Beam Epitaxy) or MOCVD (Metal Organic Chemical Vapor Deposition).

It is preferable to provide a buffer layer (2) to relieve the insufficiency in the substrate bulk crystals and facilitate the formation of epitaxial films having the same crystal axis. It is preferable that the buffer layer (2) and the substrate (1) are made of the same compound. When GaAs substrate is used, for example, then GaAs is employed as the buffer layer too in general. However, it has been a practice too to use a superlattice layer as the buffer layer. Namely, the buffer layer is made of a different compound from the one of the substrate in some cases. When a dielectric substrate is used, on the other hand, it is not always needed that the buffer layer is made of the game compound. In such a case, a material different from that of the substrate is appropriately selected as the buffer layer depending on the desired mission wavelength and the structure of the whole device.

The first conduction type of clad layer (3) is usually made of a material having a lower refractive index than the average refractive index of the active layer (4). This material is appropriately specified depending on the substrate (1), buffer layer (2), active layer (4), etc. prepared for establishing the desired emission wavelength. When GaAs is employed as both of the substrate and buffer layer (2), then AlGas system, InGaAs system, AlGaInP system, InGaP system, etc. may be used as the material for the first conduction type of clad layer, It is sometimes possible to make the whole clad layer suporlattice structure.

In one feature of the present invention first, it in important that the active layer in the vicinities of facets transparent to the emission wavelength, since no light absorption occurs and heating or degradation due to heating can be preventing thereby. Combination of p-type active layer and Si-containing passivation layer, which is a feature of the second invention, can also prevent light absorption. In general, the band gap of a semiconductor becomes smaller with an increase in the Hall density thereof, as described in, for example, Heterostructure Lasers (H. C. Casey, Jr. and M. B. Panish, Academic Press 1978, p. 157) In the case of GaAs, for example, the band gap Eg (eV) is expressed by the following formula:

$$Eg=1.424-1.6\times10^{-8}\times p^{1/3}$$

wherein P ($cm^{-3}$) means the p type carrier density. One of the characteristics of the present invention resides in that Si which is a passivation layer (14) to be inserted between the laser facet and the material of the passivation layer, for example, Si is introduced into the active layer (4), etc. as n-type impurities during long term operation of the laser, in particular, at high output, thus lowering the effective Hall density due to the compensation effect. This fact moans that the vicinities of the semiconductor, i.e., Si broaden the band gap of the part which is to be diffused as the ID is driven. It is expected that the light absorption at the facet is thus suppressed. When III-V group compound semiconductors are used as the active layer, it is Preferable to use C, Be, Mg, etc. as the dopant and the carrier ;density appropriately ranges from $1\times10^{14}$ ($cm^{-3}$) to $1\times10^{-}(cm^{-3})$, still preferably from $1\times10^{15}$ ($cm^{-3}$) to $1\times10^{17}$ ($cm^{-3}$).

When the active layer is p-type and effect of suppressing the light absorption at the facet can be achieved by broadening the band gap of the active layer facet due to the diffusion of Si to the active layer.

When the active layer is one of the n-type and the undoped, above mentioned mechanism for broadening the band gap as done in the case of the p-type does not function. However, even when the active layer is not p-type , if the facet of the active layer is transparent for the emission wavelength by means explained in the latter part, heating or degradation due to heating can be effectively prevented thereby.

From the viewpoint of selecting the material, it is preferable that the active layer (4) is made of a material containing In more preferably In and Ga. This is because such a system is liable to be ordered during the crystal growth. Namely, when Si inserted as the passivation layer (14) between the laser facet and Si diffuse when the laser is driven, as described above, it is expected that the vicinities of the facet might be disordered. In general, a disordered material results in an increase in the band gap, which together with the compensation effect of the carrier suppresses further light absorption at the facet for a long time.

By taking these factors into consideration, it is preferable to use AlGaAs system, InGaAs system, InGaP system, AlGaInP system, etc. for the active layer (4). Among all, those active layers having the quantum wall structure are preferable to achieve disordering. These materials are usually selected depending on the desired emission wavelength.

Although the active layer (4) as a usual bulk active layer consisting of a single layer, quantum well structures such as single quantum well (SQW) structure, double quantum well (DQW) structure, multiple quantum well (MQW) structure, etc. can be employed depending on the purpose. An active layer of the quantum well structure in usually employed together with an optical guide layer. To separate the quantum well, a barrier layer may be employed, if needed. As the structure of the active layer, use can be made of the separated confinement hetero structure (SCH) wherein optical guide layers are provided in both sides of the quantum well, grated index-SCH (GRIN-SCH) wherein the refractive index is continuously changed by gradually varying the composition of the optical guide layer, etc. The material of the optical guide layer may be appropriately selected from among AlGaAs system, InGaAs system, InGaP system, AlGaInP system, etc. depending on the active layer.

Similar to the first conduction type of clad layer (3), the first and second layers (5) and (8) of the second conduction type of clad layer are made of a material having a lower refractive index than the average refractive index of the active layer (4). This material is appropriately specified depending on the substrate (1), buffer layer (2), active layer (4), etc. When GaAs is employed as both of the substrate and buffer layer (2), then use may be made of AlGaAs system, InGas system, AlGaInP system, InGaP system, etc.

FIG. 2 shows two types of etching stop layers (6) and (7) and a cap layer (10). These layers, which are employed in a preferable embodiment of the present invention, are effective in precisely and easily forming the current injection region.

When the second etching stop layer (6) is made of, for example, an $Al_1 Ga_{1-a}As$ ($0\leq a\leq 1$) material, it is adequate to use GaAs. This in because the second layer of the second conduction type of clad layer (8), etc. can be grown with a good crystallinity in the re-growth in the AlGaAs system, It is usually preferable that the second etching stop layer is 2 nm or move in thickness.

As the first etching stop layers (7), it is appropriate to use a layer represented by $In_bGa_{1-b}P$ ($0\leq b\leq 1$). When GaAs is employed an the substrate an in the case of the present invention, b=0.5 is employed usually in a lattice-matched system. The first etching stop layer (7) is usually 5 nm or more, preferably 10 nm or more, in thickness. When its thickness is less than 5 nm, it is feared that etehing cannot be inhibited due to uneven film thickness, etc. On the other hand, a strain system can be used depending on the film thickness-and, in such a came, b may be 0 or 1.

Cap layers (10) are employed as protective layers for the current block layers (9) in the first growth and to facilitate the growth of the second layer (8) of the second conduction type of clad layer, Before obtaining the element structure, these cap layers are partly or completely eliminated.

The current block layers (9) should literally block current. Therefore, it is preferable that these layers have the same conduction type of that of the first conduction type of clad layer (3) or undoped. For example, it is preferable that a current block layer (9) made of an AlGaAs system has a refractive index lower than that of the second layer (8) of the second conduction type of clad layer made of $Al_yGa_{1-y}As$ (0<y≦1). When the current block layer is $Al_zGa_{1-z}As$ (0≦z≦1), therefore, it is preferable that z is larger than y in the alloy.

The second layer (8) of the second conduction type of clad layer usually has a refractive index lower than that of the active layer (4). The second layer (*) of the second conduction type of clad layer is usually the sue as the first conduction type of clad layer (3) and the first layer (5) of the second conduction type of clad layer, In a preferred embodiment of the present invention, the first layer (5) of the second conduction type of clad layer, the second layer (8) of the second conduction type of clad layer and the current block layer (9) are all made of the same material system of the am composition. In such a case, a difference in effective refractive index is formed by the first etching stop layers (7). When the cap layers (10) are not completely eliminated, a difference in effective refractive index is formed by the cap layers (10), in addition to the one formed by the first etching stop layers (7). This layered structure is highly preferable, since various problems caused by the difference in the materials or compositions at each interface between the second layer (8) of the second conduction type of clad layer and the current block layer (9).

It is preferable to provide a contact layer (11) on the second layer (8) of the second conduction type of clad layer so as to lower the contact resistance with the electrode (12). This contact layer (11) in usually made of a GaAs material. To lower the contact resistance with the electrode (12), the carrier density in this layer is higher than other layers.

In usual, the thickness of the buffer layer (2) ranges from 0.1 to 3 $\mu$m; that of the first conduction type of clad layer (3) ranges from 0.5 to 3 $\mu$m; that of the active layer ranges from 0.0005 to 0.02 $\mu$m per layer (in the case of the quantum well structure); that of the first layer (5) of the second conduction type of clad layer ranges from 0.05 to 0.3 $\mu$m; that of the second layer (8) of the second conduction type of clad layer ranges from 0.5 to 3 $\mu$m; that of the cap layer (10) ranges from 0.05 to 0.5 $\mu$m, and that of the current block layer (9) ranges from 0.3 to 2 $\mu$m.

The semiconductor light emitting device as shown in FIG. 2 is further provided with electrodes (12) and (13). In the p-type, the electrode (12) is formed by metallizing the surface of the contact layer (11) with, for example, Ti/Pt/Au successively and then alloying. On the other hand, the electrode (13) is formed on the surface of the substrate (1). In the n-type, the substrate (1) is successively deposited with AuGeNi/Au followed by alloying.

The wafer of the semiconductor laser thus formed is cleaved so as to give a so-called laser bar. In the present invention, troublesome cleavage in vacuum is not always needed in general. This is because, when cleavage is performed under atmospheric pressure or in a nitrogen atmosphere, it is possible to eliminate oxide of at least one of the elements constituting the first conduction type icf clad layer (3), active layer (4), second conduction type of clad layers (5) and (8), the substrate (1), buffer layer (2), first etching stop layer (7), second etching stop layer (6), current block layer (9), cap layer (10), contact layer (11), etc. each exposed at the facets acting as non-radiative recombination center at the facets of the elements in the vicinities of the cavity facets.

Plasma irradiation may be cited as one of the techniques therefor. It is particularly effective to irradiate with ionized rare gas plasma, still preferably Ar plasma. It is preferable to control the Irradiation energy of this Ar plasma to a low level of 25 to 300 eV, still preferably 25 to 100 eV. Thus oxide(s), nitride (s) etc. acting as non-radiative recombination center can be eliminated. This treatment is superior to the conventional ones such as ion-implantation of impurities in that it can be effected at an extremely low energy and thus the process can be completed while preventing the facet from damages. From the viewpoint of eliminating oxides from the facets, As—O can be thus eliminated particularly effectively. Also, Ga—O, etc. can be effectively eliminated thereby.

In other words, it is essential in the present invention that at least one of the constituting elements of the first conduction type of clad layer, active layer and second conduction type of clad layer, which are usually provided even in a semiconductor laser with the simplest structure, the vicinities of facets do not have their oxides. As described above, it in important that oxide(s) (As—O, Ga—O, etc.) acting as non-radiative recombination center on the facets are eliminated.

However, it is reasonable in general that oxides of the elements in the vicinities of the facets would be thus eliminated too in other layers of a laser such as the substrate and the current block layer. This in because the whole facets are usually irradiated with the above-mentioned Ar plasma. Needless to say, it is important to treat the first conduction type of clad layer, active layer and second conduction type of clad layer as described above.

More particularly speaking, it is most important in a laser having the refractive index guided structure, which has been cited above am a preferred embodiment of the present invention, that at least one of the elements constituting the first conduction type of clad layer (3), active layer (4) and second conduction type of clad layers (5) and (6) does not exist as its oxide at the facets thereof. In association therewith, the components such as the substrate (1), buffer layer (2), first etching stop layer (7), second etching stop layer (6), current block layer (9), cap layer (10), contact layer (11), etc., each exposed at the facets, are also irradiated with the plasma and, as a result, oxides are eliminated therefrom. This phenomenon never inhibits the achievement of the objects of the present invention. In the current block layer, etc. wherein some of near-field pattern remain, it is rather preferable that no oxides or nitrides of the constituting elements exist at the facet of the block layer.

Methods for analyzing the presence of the oxide of at least one constituting element are exemplified by the X-ray photoelectron spectroscopy (XPS). This method is highly advantageous in analyzing the chemical binding manner of each element. The facets of a laser is irradiated with X-ray of 100 $\mu$m×100 $\mu$m and then the photoelectrons thus formed are subjected to energy spectroscopy, thus confirming the chemical binding manner of each element constituting the laser facets. By varying the angle of the photoelectron detector to the sample surface in this step, information in the vicinities of alone can be easily obtained, As will be described hereinafter, lasers are generally coated with a dielectric material optionally combined with a semiconductor at the facets. Prior to the above-mentioned XPS analysis, it is therefore a practice to reduce the thickness of the coating film so as to give to a thickness appropriate for the analysis by various etching techniques. In the case of a laser having a thin costing film of about 2 $\mu$m, the facets of the semiconductor laser can be analyzed without effecting the above etching procedure, etc.

On the other hand, the effects achieved by the irradiation with low energy argon plasma is not only the elimination of oxides such as Ga—O, As—O as described above. When the active layer forms quantum well and is made of, in particular, a system containing In or more preferably In and Ga such as an AlGaAs-system material, an InGaP-system material or an AlGaInP-system material, the vicinities of the facets can be disordered not due to the diffusion of Si during driving but in the process of producing the laser. In this case, moreover, facets with higher resistance can be prepared. These facts indicate in the early stage of the formation of the laser, it is possible to broaden the band gap in the vicinities of the facets and, at the same time, increase the resistance in the vicinities of the facets. Thus, light absorption at the facets can be suppressed and the current injection into the facets liable to be broken can be also inhibited, thus further prolonging the life of the laser.

That is to say, the above-mentioned plasma irradiation is efficacious in broadening the band gap in the vicinities of the facets during the process of fabricating LD. Moreover, the band gap in the vicinities of the facets is further broadened when the LD is driven, which makes it possible to embody an element having high output and high reliability.

Cleavage is appropriately employed in forming the facets. Although this procedure is widely used in edge-emission lasers, it is sometimes usable in a came where cavities are formed during the growth of crystals, as in vertical cavity surface emitting lasers.

The facet formed by cleavage differs depending on the orientation of the substrate employed. To form an element such as an edge-emission laser by using a substrate having a face crystallographically equivalent to nominally (100) face employed, (110) face or a face crystallographically equivalent thereto serves as each of the faces for forming a cavity, When the above-mentioned off-angle substrate (miss oriented substrate) is employed, the facets do not always most at right angles with the direction of the cavity depending on the inclination direction. When a substrate with an inclination of 2° to the direction (1–10) to the substrate (100) is employed, each of the facets is also inclined by 2°.

In the present invention, a passivation layer is a layer deposited on the facet of the semiconductor light emitting device, preventing the facet from degradation due to chemical reaction with oxygen.

The passivation layer should be formed to cover at least the first conduction type of clad layer, the active layer, and the second conduction type of clad layer forming the facet. However, the passivation layer is usually formed to cover the whole surface of the facet.

Si,Ge,S and Se are suitable materials for the passivation layer, but Si is thought to be the best. It is preferable that the passivation layer contains more than 50 atomic % of Si.

Although Si deposited to the semiconductor facet as the passivation layer (14) as shown in FIG. 2 has various crystallographic characteristics, either single crystal, polycrystalline or amorphous can achieve the effects.

It is particularly appropriate to use amorphous Si formed at a low deposition rate in high vacuum. Although the bond edge of Si varies depending on the film properties in general, it is transparent to light of wavelength of about 2 μm or longer without showing any absorption. On the contrary, Si shows a refractive index N of (n+ik) to light of emission wavelength of about 2 μm or shorter, wherein n means the real number part of the refractive index, k is am extinction coefficient and n is about 3.5.

It is generally preferable that the thickness of the passivation layer (14) is thicker than 0.2 nm. However, an extremely thick passivation layer of, for example, 100 nm is unsuitable in some cases. The lower limit of the preferable thickness of the passivation layer (14) is specified by the factors for the existence of the passivation layer per se as a film, while the upper limit thereof is determined from the balance with the effect of Si of absorbing light emitted from the active layer. When Si is deposited on the facet, namely, consideration should be made on the factor of coating the whole facet with the passivation layer and the effect of an increase in the temperature at the facet due to the absorption by Si. According to the experiments carried out by the present inventors, the following range in preferable:

$$0.2(nm) < T_{Si} < \lambda/8n(nm) \qquad (I)$$

wherein n means the real number part of the refractive index of the above-mentioned Si layer at emission wavelength λ. However, the effects are confirmed when the passivation layer has a thickness not more than 0.2 nm.

In general, a semiconductor laser is preferably provided with a coating layers (15) and (16) comprising a dielectric material passivation optionally combined with a semiconductor and deposited on the passivation layers (14) formed on the exposed semiconductor facets. It is still preferable that the ion-irradiation of the facets, the formation of the passivation layers (14) and the formation of the coating layers (15) and (16) are successively performed in vacuum without braking vacuum to thereby increase an external differential quantum efficiency and further protect the facets. To achieve a high output, it is a practice to form an anti-reflective coating layer on the front facet and a high-reflective coating layer on the rear facet, i.e., asymmetric coating.

Various materials are usable in this coating method. It is preferable to use one or more compounds selected from the group consisting of $AlO_x$, $TiO_x$, $SiO_x$, SiN, Si and ZnS. As the anti-reflective coating layer, use is made of $AlO_x$, $TiO_x$, $SiO_x$, etc., while use in made of an $AlO_x/Si$ multilayered film, a $TiO_x/SiO_x$ multilayered film, etc. for the high-reflective coating layer The thickness of each layer is controlled so as to give the desired reflectance. It is a practice to use $AlO_x$, $TiO_x$, $SiO_x$, etc. as the anti-reflective coating layer while controlling so as to make the film thickness at emission wavelength λ about λ/4n, wherein n means the real number part of the refractive index, Also, the high-reflective coating layer made of various materials is controlled to give a film thickness of bout λ/4n. It is appropriate to further deposit a pair of these layers depending on the purpose.

To form the coating layers (15) and (16), it in adequate to use the so-called ion assisted deposition (IAD) method. In this method which comprises evaporation of the coating materials simultaneously with irradiation with ion of a definite energy, it is particularly preferable to perform ion deposition with a rare gas. IAD with Ar ion, among rare gases, is particularly effective in improving the film properties of the above-mentioned coating materials. It is still preferable to use Ar ion within a low energy range of from 25 to 300 eV, still preferably 50 to 200 eV. Thus coating can be completed without damaging the semiconductor facets.

In the third feature of the present invention, a wafer obtained by forming electrodes is cleaved into laser bars and then at least one of facets forming the cavity is irradiated in vacuum with plasma having an optimized energy. According to the present invention, the facet(s) are treated after the formation of the electrodes, which makes it possible to form electrodes on water before cleavage for exposing the facets. As a result, the troublesome stop of forming electrodes on each of the laser bars after cleaving can be omitted, which brings about an industrial advantage compared with the conventional process wherein the facets are made transparent by forming a semiconductor layer thereon.

As the plasma to be irradiated, it is preferable to use those of the elements of the group 18 (Ar, etc.).

The Ar plasma to be irradiated has an energy of from 25 eV to 300 eV. When the energy of this Ar plasma is less than 25 eV, the irradiation with the Ar plasma can achieve only an insufficient effect and thus the problem of the sudden failure during long term operation of the laser under APC mode cannot be solved thereby. When the energy exceeds 300 eV, on the other hand, disordering arises too vigorously and thus the laser is liable to be broken, which results in a decrease in the maximum output in the initial characteristics. In this step, it is preferable to perform the plasma irradiation at a current density of from 1 $\mu A/cm^2$ to 1 $mA/cm^2$ for 15 seconds to 30 minutes.

Subsequently, the facets may be asymmetrically coated.

Usually, a single-layered $AlO_x$ film, $SiO_x$ film, $SiN_x$ film, etc. is formed on the front facet from which light is taken out to give a low reflective face, while a multi-layered $AlO_x$/α—si film, $SiO_x$/$Tio_x$ film, etc. is formed on the rear facet to give a high reflective face. In this step, it is preferable that the reflectance in the front facet side ranges from 0.5 to 20%, still preferably from 1 to 10%, while that in the rear facet side ranges from 50 to 98%, still preferably from 85 to 95%. Inr the present invention, the asymmetric coating of the facets is preferably effected following the plasma irradiation under continuous evacuation. The laser bars asymmetrically coated at the facets are divided into chips and employed as laser diodes (LD).

Figure 24:
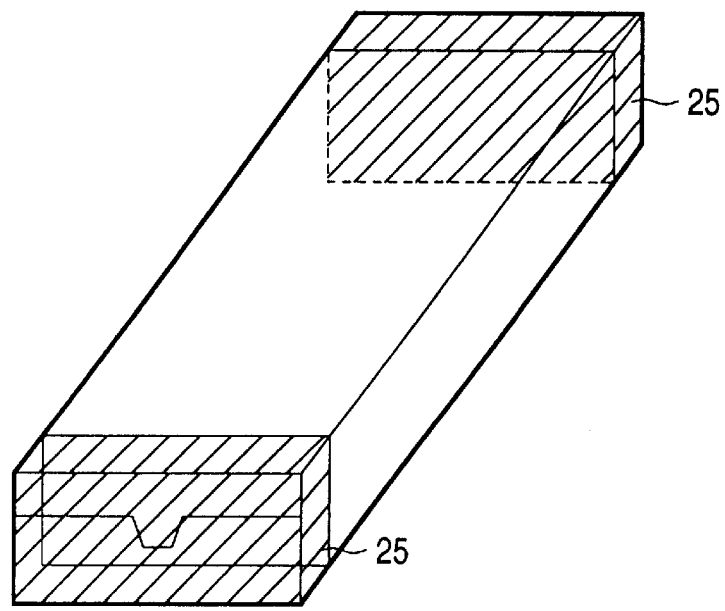
FIG. 24 is a perspective view of the semiconductor laser with a disordered and high resistant region of the present invention.

FIG. 24 is a perspective view of the semiconductor laser of the present invention. The facets and vicinities thereof (region 25) are the high-resistant regions formed by the plasma irradiation and quantum wells in the vicinities of the facets are disordered thereby. Thus, the vicinities of the facets are made transparent to the emission wavelength of the laser, In the shaded parts, carriers are passivation and made highly resistant by exposing each layer to the plasma. Thus, current can hardly pass therethrough and no current is injected into both facets, which lessens degradation in the characteristics of the element due to reactive current, etc.

The semiconductor laser of the present invention is one wherein a first conduction type of clad layer, an active layer containing quantum wall and a second conduction type of clad layer are provided on a substrate, characterized in that at least one of the facets forming tie cavity is irradiated from the facet side with plasma having energy of from 25 eV to 300 eV. Thus, highly resistant regions are formed in the vicinities of the facets of the semiconductor substrate, first conduction type of clad layer, active layer containing quantum well and second conduction type of clad layer. Such a region shows a higher resistance than the parts in the same layer less affected by the plasma irradiation. The highly resistant region in the vicinities of the facet of the active layer containing quantum well is disordered. Such a semiconductor laser makes it possible to very easily and stably produce the so-called window structure. Since the higher resistant regions are formed at the same time, moreover, there arises no problem of the so-called reactive current. Thus semiconductor laser diodes having high output and high reliability can be easily obtained.

Although the above description relates to semiconductor lasers of the group having the refractive index guided structure mechanism, the present invention is applicable to any semiconductor lasers (ridge type semiconductor lasers, lasers having the gain guided structure, etc.) regardless of the constitution thereof, so long as these lasers have the characteristics as set forth in the claims of the present application.

The process for producing a semiconductor light emitting device which is the fourth feature of the present invention, is one for producing a semiconductor light emitting device having a compound semiconductor layer containing a first conduction type of clad layer, an active layer and a second conduction type of clad layer and formed on a substrate and having a cavity, characterized by comprising forming the compound semiconductor layer on the substrate by the successive crystal growth; next forming the cavity facets; then desorping (removing) at least a part of the constituting elements in the vicinities of the active layer; and forming passivation layers in vacuum. The structure of the element, etc. are not particularly restricted, so long as the process has the characteristics described above, Now, illustration will be made, by way of example, on the application of the present invention to the production of a semiconductor laser having the refractive index guided structure, wherein the second conduction type of clad layer is divided into the first and second layers, a current injection region is formed by the second layer of the second conduction type of clad layer and the current block layer, and contact layers are provided to lower the contact resistance with electrodes.

Similar to first to third features as described above, the thus formed semiconductor wafer is cleaved to give so-called laser bars. In the present invention, troublesome cleavage in vacuum is not always needed in general. This is because, when cleavage is performed under atmospheric pressure or in a nitrogen atmosphere, it is possible to suppress the absorption of the emission wavelength at the facets. One of the techniques therefor is to desorp a part of the constituting elements in the vicinities of the facet of the active layer to thereby make the active layer in the vicinities of the facet transparent to the emission wavelength. Particular procedures therefor include irradiation of an facet with heat beam with quick heat response, irradiation with charged particles (ion beam, electron beam or plasma which is a combination of ion and electron ), photo irradiation, etc, As described above, the material of the active layer (4) may be appropriately selected depending on the desired emission wavelength and output, In the case of $In_uGa_{1-u}As$ (0.15≦u≦0,35) usually employed to give an emission wavelength of about 980 nm, the vapor pressures relating to the desorption of the As compounds in vacuum are expressed as InAs>GaAs>AlAs. Frorm these mixed crystal semiconductors, a certain element can be selectively desorped by selecting an appropriate treating temperature. For example, InAs in InGaAs is selectively dosorped at 500 to 650° C. Thus, a region with a low In density can be formed in the heat treated region by selectively heating the vicinities of the facet. Thus, the band gap in the vicinities of the surf ace can be broadened and a so-called window structure can be formed exclusively in the vicinities of the facet.

The heat source or light source to be used for irradiation may be any one, so long an it contains the wavelength absorbed by the material employed for the active layer. Usually, a halogen lamp, a xenon lamp, etc. may be appropriately employed as a heat source or a light source.

In the case of electron-irradiation, it is preferable to use electron beam of 100 eV to 100 keV in energy. The irradiation dose may be appropriately controlled so that the surface temperature of the laser bars is increased to the desired level. To relieve the heat load of the whole laser bars, it is preferable to complete the irradiation within a short period of time, namely, not longer than 10 minutes in usual, preferably not longer than 5 minutes.

In the fifth feature of the present invention, the wafer thus completed after the formation of the electrodes is cleaved Into laser bars and then at least one of the facets forming the cavity is irradiated in vacuum with ion, electron, light and/or heat. In the present invention, the facets can be treated after the formation of the electrodes. In other words, the electrodes can be formed on the water before cleavage for exposing the facets. As a result, the troublesome stop of forming electrodes on each of the laser bars after cleavage can be omitted, which brings about a structural advantage compared with the conventional process wherein the facets are made transparent by forming a semiconductor layer thereon, The ion, electron light and/or heat to be irradiated may be appropriately selected depending on the purpose of selectively desorping element(s) with high vapor pressure. In the case of phtoirradiation, the light source may be any one, so long as it contains the wavelength absorbed by the material employed for the active layer. Usually, a halogen lamp, etc, may be appropriately employed therefor. In the ease of electron-irradiation, it is preferable to use electron beam of 100 eV to 100 keV in energy, The irradiation dose may be appropriately controlled so that the surface temperature of the laser bars in increased to the desired level. To relieve the heat load of the whole laser bars, it is preferable to complete the irradiation within a short period of time, namely, not longer than 10 minutes in usual, preferably not longer than 5 minutes. These heating conditions may be determined by preparing samples for measuring temperature together with the laser bars and estimating the temperature increased after the completion of the process. However, the effect of transparent finishing cannot be achieved at a low temperature, while an excessively high temperature causes troubles in chips. Thus, the optimum heating conditions can be established by repeating the experiment several times.

Figure 25:
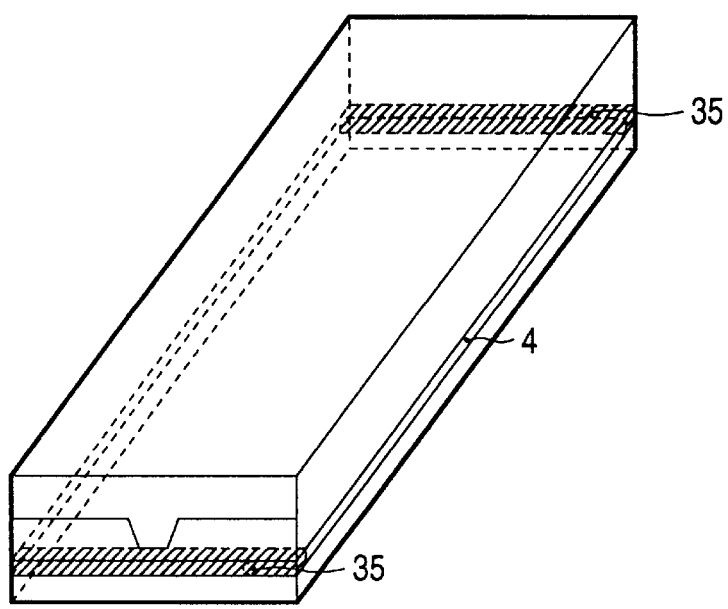
FIG. 25 is a perspective view of the active region, which is transparent to emission wavelength, of semiconductor laser of the present invention.

Thus, impurities such as oxides remaining on the facets can be eliminated by heating the vicinities of the facet via irradiation with ion, electron, light and/or heat. At the same time, specific element(s) are selectively desorped from the region in the vicinities of the facets by taking advantage of the difference among desorption rate of the elements constituting the active layer. Thus a region having a broader band gap than the energy corresponding to the emission wavelength of the laser can be efficiently formed in the vicinities of the facet of the active Subsequently, the facets may be asymmetrically coated. Usually, a single-layered $AlO_x$ film, $SiO_x$ film, $SiN_x$ film, etc. is formed on the front facet from which light is taken out to give a low reflection, while a multi-layered $AlOx/\alpha$—Si film, $SiO_x/Tio_x$ film, etc. is formed on the rear facet to give a high reflection. In the present invention, the asymmetric coating of the facets is preferably effected following the plasma Irradiation under continuous evacuation without breaking a vacuum after Ar irradiation . The laser bars asymmetrically coated at the facets are divided into chips and employed as laser diodes (LD). FIG. 25 is a perspective view of the semiconductor laser of one of the present invention, The facets and vicinities thereof are the transparent regions 35 suffering from the selective desorption due to the irradiation with ion, electron, light and/or heat electron beam. The vicinities of both facets are made transparent to the emission wavelength of the laser.

The semiconductor laser of the present invention comprises having a first conduction type of clad layer, an active layer containing quantum wall and a second conduction type of clad layer on a semiconductor substrate, wherein at least one of the facets forming the cavity is irradiated with optimized ion electron, heat and/or light to thereby form a region with different composition due to desorption at least in the vicinities of the facet of the active layer containing quantum well. Namely, the semiconductor laser of the present invention is characterized in that said region has a broader band gap than that of the adjacent unirradiated regions in the same layer and is transparent to the emission wavelength of the laser. This so-called window structure con be very conveniently and stably constructed. At the same time, moreover, impurities remaining on the facets can be eliminated and thus the surface state density due to these impurities can be lowered. Thus, semiconductor laser diodes having high output and high reliability can be easily obtained.

The structure of the semiconductor light emitting device of the sixth feature of the present invention is nor particularly restricted, so long as it is a compound semiconductor light emitting device having an emission wavelength of $\lambda$ (nm) wherein at least a first conduction type of clad layer, an active layer and a second conduction type of clad layer are grown on a substrate and two facets being opposite to each other form a cavity, characterized in that the surfaces of the first conduction type of clad layer, active layer and second conduction type of clad layer forming the facets are transparent, in the vicinities of the active layer, to the emission wavelength $\lambda$ (nm) and coated with passivation layers comprising silicon and the surfaces of these passivation layers are coated with coating layers comprising a dielectric material optionally combined with a semiconductor. As a particular example of this structure, illustration will be made on a semiconductor laser having the refractive index guided structure, wherein the second conduction type of clad layer is divided into the first and second layers, a current injection region is formed by the second layer of the second conduction type of clad layer and the current block layer and a contact layer is further provided so as to lower the contact resistance with the electrode.

To further illustrate the present invention in greater detail, the following Examples will be given. However, it is to be understood that the present invention is not restricted and various modification may be made within the true spirit and scope of the invention.

EXAMPLE 1

Now, the first example of the present invention will be described.

In this example, facets of a cavity of a semiconductor laser were irradiated with argon plasma in vacuum. Then amorphous silicon was electron beam-evaporated onto these facet in vacuum to give passivation layer 14. Next, $AlO_x$-layers were formed respectively on the front and rear facets by the IAD (Ion Assisted Deposition) method to give coating layers 15 and 16 (refer to FIG. 1)

As FIG. 2 shows, semiconductor layers were successively grown on a substrate by spitaxial growth and thus a wafer for forming a laser of the groove type was formed as shown below.

On an n-Oaks substrate (1) having a carrier density of $1 \times 10^{18}$ cm$^{-3}$ were grown by the MBE method, an n-GaAs layer having a thickness of 1 $\mu$m and a carrier density of $1 \times 10^{18}$ cm$^-$as a buffer layer (2) and an n-$Al_{0.35}Ga_{0.65}As$ layer having a thickness of 1.5 $\mu$m and a carrier density of $1 \times 10^{18}$ cm$^{-3}$ as a first conduction type of clad layer (3), Next, on the first conduction type of clad layer (3), an active layer (4) consisting of an undoped GaAs optical guide layer having a thickness of 24 nm; an undoped $In_{0.2}Ga_{0.8}As$ single quantum well (SQW) having a thickness of 6 nm; and an undoped GaAs optical guide layer having a thickness of 24 mm, which were successively grown and; a p-$Al_{0.35}Ga_{0.65}As$ layer having a thickness of 0.1 μm and a carrier density of $1\times10^{18}$ $cm^{-3}$ as a first layer (5) of the second conduction type of clad layer; a p-GaAs layer having a thickness of 10 nm and a carrier density of $1\times10^{18}$ $cm^{-3}$ as a second etching stop layer (6); an n-$In_{0.5}Ga_{0.5}P$ layer having a thickness of 20 nm and a carrier density of $5\times10^{17}$ $cm^{-3}$ as a first etching stop layer (7); an n-$Al_{0.39}Ga_{0.61}As$ layer having a thickness of 0.5 μm and a carrier density of $5\times10^{17}$ $cm^{-3}$ as a current block layer (9); and an n-GaAs layer having a thickness of 10 nm and a carrier density of $1\times10^{18}$ $cm^{-3}$ as a cap layer (10) were grown by the MBE method successively.

Next, all the surface of the uppermost layer except the current injection region was covered with a $SiN_x$ mask having an window of 1.5 μm in width. Etching was performed by using the first etching stop layer as an etching stop layer so as to eliminate the cap layer (10) and the current block layer (9) in the current injection region (corresponding to a region exposed by the window). This etching was carried out with the use of a mixture of sulfuric acid (98 wt. %), hydrogen peroxide (a 30% aqueous solution) and water (1:1:5 by volume) as an etchant at 25° C. for 30 seconds.

Then the $SiN_x$ layer was eliminated by immersing the substrate with compound semiconductor layers in an etching solution comprising HF (49%) and $NH_4F$ (40%) (1:6) for 2.5 minutes. Subsequently, the first etching stop layer in the current injection region was eliminated by etching with the use of the second etching stop layer as an etching stop layer. This etching was carried out with the use of a mixture of hydrochloric acid (35 wt. %) and water (2:1) as an etchant at 25° C. for 2 minutes, Subsequently, a p-$Al_{0.35}Ga_{0.65}As$ layer having a carrier density of $1\times10^{18}$ $cm^{-3}$ was grown as the second layer (8) of the second conduction type of clad layer by MOCVD method to give a thickness of 1.5 μm in buried part (i.e., the current injection region). Finally, a p-GaAs layer having a thickness of 7 μm and a carrier density of $1\times10^{19}$ $cm^{-3}$ was grown as a contact layer (11) to realize good electric contact with the electrode to thereby form a laser element. The width W of the current injection region, i.e., the interface of the second layer of the second conduction type of clad layer with the second etching stop layer was 2.2 μm.

Onto this wafer, AuGeNi/Au was evaporated on the substrate side as an n-type electrode, while Ti/Pt/Au was evaporated as a p-type electrode followed by alloying at 400° C. for 5 minutes to thereby form a wafer completely.

Next, this wafer wan cleaved into laser bars of 700 μm in cavity length and these laser bars were put into a vacuum chamber with an ion-gun to generate Ar plasma. Then the front facet was irradiated from the side of this facet with Ar plasma of 60 eV in average energy and 150 μA/$cm^2$ in current density for 1 minute.

Subsequently, amorphous Si wan deposited in a thickness of 2 nm on the front facet by the conventional electron beam evaporation method. Then an $AlO_x$ film of 165 nm in thickness was formed as a coating layer so as to make the reflectance at the front facet 2.5% at an emission wavelength of 980 nm. In the $AlO_x$ film formation, Ar plasma having average energy of 120 eV and current density of 200 A/$cm^2$ and source of $AlO_x$ wore applied to the front facet at the same time, which is so-called IAD method. It was confirmed that the real number part of the refractive index of the amorphous Si at 980 nm was about 3.4.

Subsequently, the laser bars were once taken out from the vacuum chamber to treat the rear facet. Then the rear facet was treated in the same manner as those employed for the front facet except that the coating layer was formed so as to consist of four films, namely, 170 nm $AlO_x$/60 nm Si/170 nm $AlO_x$/60 nm Si. As a result, the reflectance at the rear facet was 92%. Also, the $AlO_x$ films were formed by IAD method in the same manner as those employed for the front facet.

Figure 3:
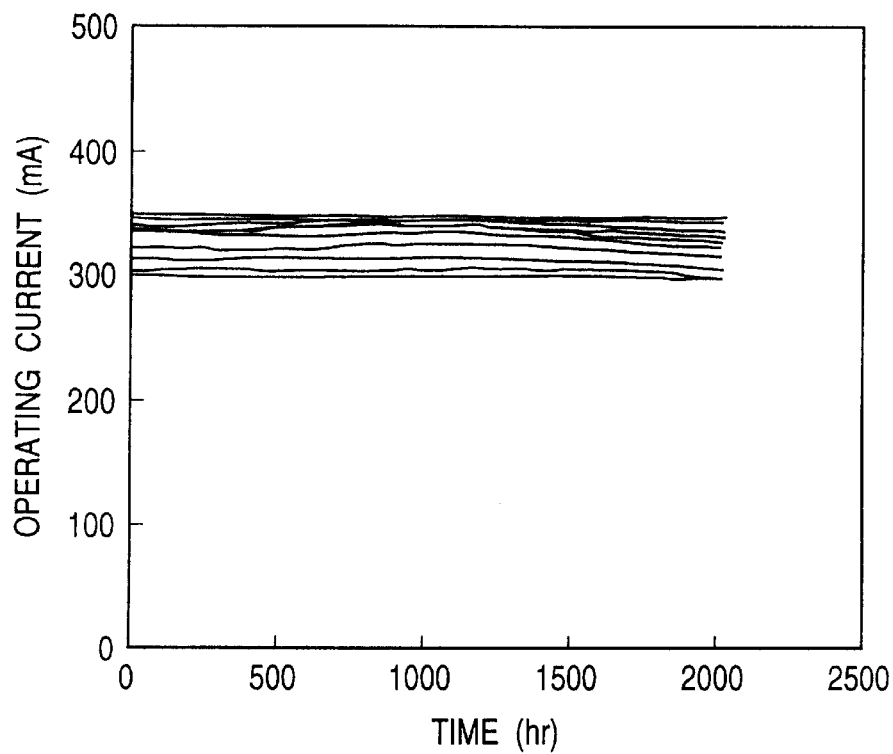
FIG. 3 shows the results of the life test (200 mW, output, 50° C., in APC mode) on the semiconductor laser of Example 1 of the present invention.

From these laser bars, 10 devices were put onto a heat sink and packaged in a nitrogen atmosphere. These devices showed a threshold current of 23 mA at 25° C. and kink was observed at 350 mA, 250 mW as the average initial characteristics. When subjected to an accelerated life test (200 mW, 50° C.) of APC (Automatic Power Control) mods, these samples showed no sudden failure within 2,000 hours, an shown in FIG. 3, indicating stable driving. Neither Ga—O nor As—O is detected when such treated facets are subjected to XPS measurement with the detection angle of photo-electron of 75°. Ga—O and As—O exist on the GaAs (110) face once exposed to the atmosphere.

Further, one of the elements thus formed is processed into a sample for transmission electron microscopic observation and the active layer in the vicinities of the facets are compared with bulks, As a result, it is confirmed that the vicinities of the facets irradiated with the Ar plasma show damaged crystallinity, i.e., disordering.

One device is taken out from these laser bars as a sample for analysis. The $AlO_x$ layer and Si layer at the front facet are eliminated by using a hydrofluoric acid-based etchant. Then the device is introduced into an apparatus for vacuum analysis and the band gap in the vicinities of the front facet of the active layer is measured by the electron energy-loss spectroscopy. This electron energy-loss spectroscopy, by which the information exclusively in the vicinities of the sample surface (the maximum analytical depth: about 1.5 nm) can be obtained, is a useful means for measuring the band gap in the vicinities of the laser facet without being affected by the physical values of the bulk region. The vicinities of the active layers of laser facet are irradiated with electron beam (100 nm, 1,000 eV) . Then analysis is made on the diffraction energy of loom electron below the surface oxidation layer at a depth of 1 nm. Thus it is found out that the band gap at the InGaAs active layer facet is 1.5 eV and the band gap on the facet of the GaAs optical guide layer is 1.65 eV, each due to the loss peak caused by band-to-band transition. The energy gap between quantum levels in the InGaAs quantum well active layer at room temperature, determined by measuring the photoluminescence, is 1.29 eV, while the band gap of GaAs was 1.41 eV, Thus it is confirmed that the band gap in the vicinities of the facet is broadened mainly by the Ar plasma irradiation and that the facet is transparent to the emission wavelength.

EXAMPLE 2

Laser bars were produced by the same method an the one of the above Example 1 but the coating layer on the rear facet consisted of six continuous films $SiO_x$ (200 nm) /$TiO_x$ (120 nm) /$SiO_x$ (200 nm)/$TiO_x$ (120 nm)/$SiO_x$ (200 nm)/$TiO_x$ (120 nm) and to give the reflectance of the rear facet of 88%.

Figure 4:
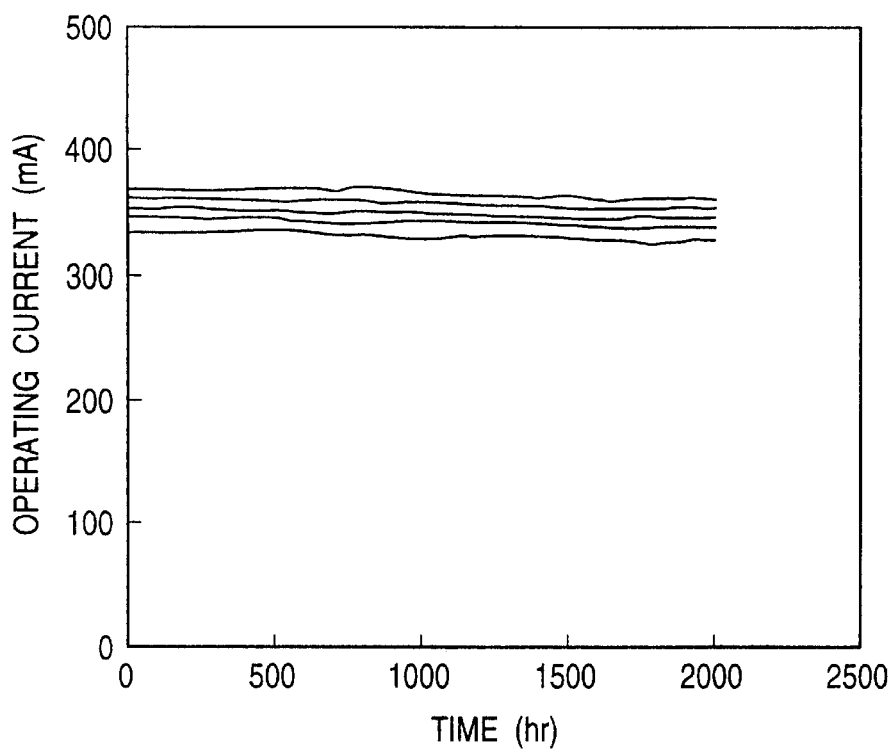
FIG. 4 shows the results of the life test (200 mW, output, 50° C., in APC mode) on the semiconductor laser of Example 2 of the present invention.

Five devices were put onto a heat sink and packaged in a nitrogen atmosphere. These devices showed a threshold current of 25 mA at 25° C. and kink was observed at 359 mA, 240 mW an the average initial characteristics. When subjected to a life test of APC mode (200 mW, 50° C.), these samples showed no sudden failure within 2,000 hours, as shown in FIG. 4, indicating stable driving.

Neither Ga—O nor As—O is detected when such treated facets are subjected to XPS measurement with the detection angle of photo-electron of 75°.

Further, one of the elements thus formed is processed into a sample for transmission electron microscopic observation and the active layer in the vicinities of the facets were compared with bulks, As a result, it is confirmed that the vicinities of the facets irradiated with the Ar plasma show damaged crystallinity, i.e., disordering.

It is confirmed that the band gap in the vicinities of the facet is broadened mainly by the Ar plasma irradiation and that the facet is transparent to the emission wave length in the same manner as in Example 1.

COMPARATIVE EXAMPLE 1

Figure 5:
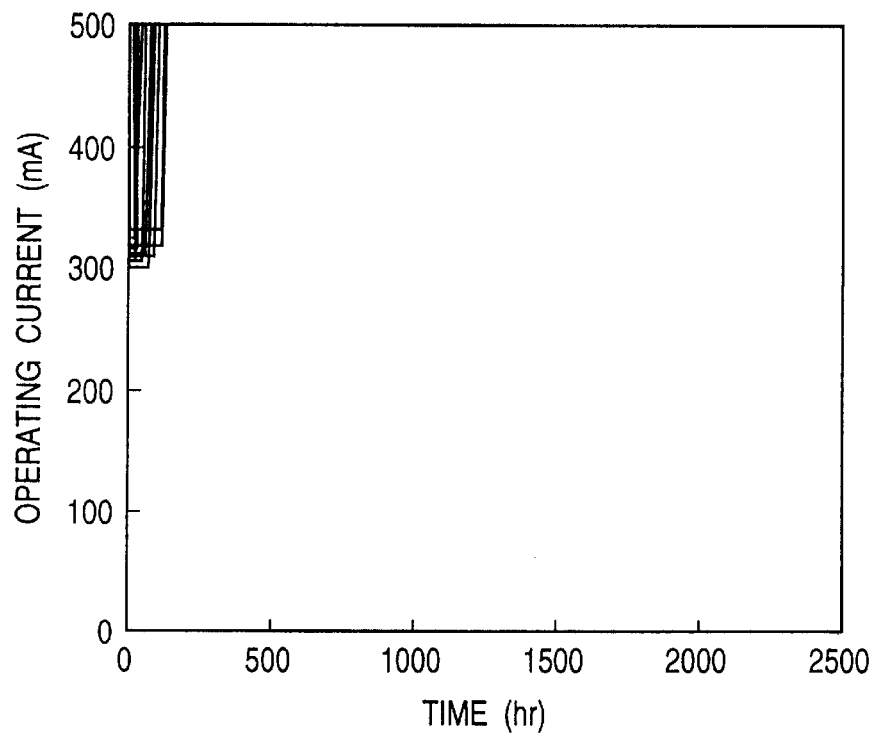
FIG. 5 shows the results of the life test (200 mW, output, 50° C., in APC mode) on the semiconductor laser of Comparative Example 1 of the present invention.

The procedure of Example 1 was repeated but the step of the formation of the Si passivation layers on the front and rear facets, and the previous step of the Ar plasma irradiation were omitted and the conventional electron beam evaporation method was employed for all layers as a substitute for the IAD method. The obtained devices showed a threshold current of 23 mA at 25° C. and kink was observed at 350 mA, 250 mW as the average initial characteristics, similar to Example 1. When 10 devices were subjected to a life test of APC mode (200 mW, 50° C.), all of the samples underwent sudden failure within 100 hours, as shown in FIG. 5.

Both Ga—O and AS—O are detected when the facets are subjected to XPS measurement with the detection angle of photo-electron of 75°.

Further, one of the elements thus formed is processed into a sample for transmission electron microscopic observation and the active layer in the vicinities of the facets are compared with bulks, As a result, the vicinities of the facets look almost the same as the bulks.

It is confirmed that the band gap in the vicinities of the facet is the same as those of InGaAs quantum well or GaAs bulk in the laser diode when measured by electron energy-lose spectroscopy.

COMPARATIVE EXAMPLE 2

Figure 6:
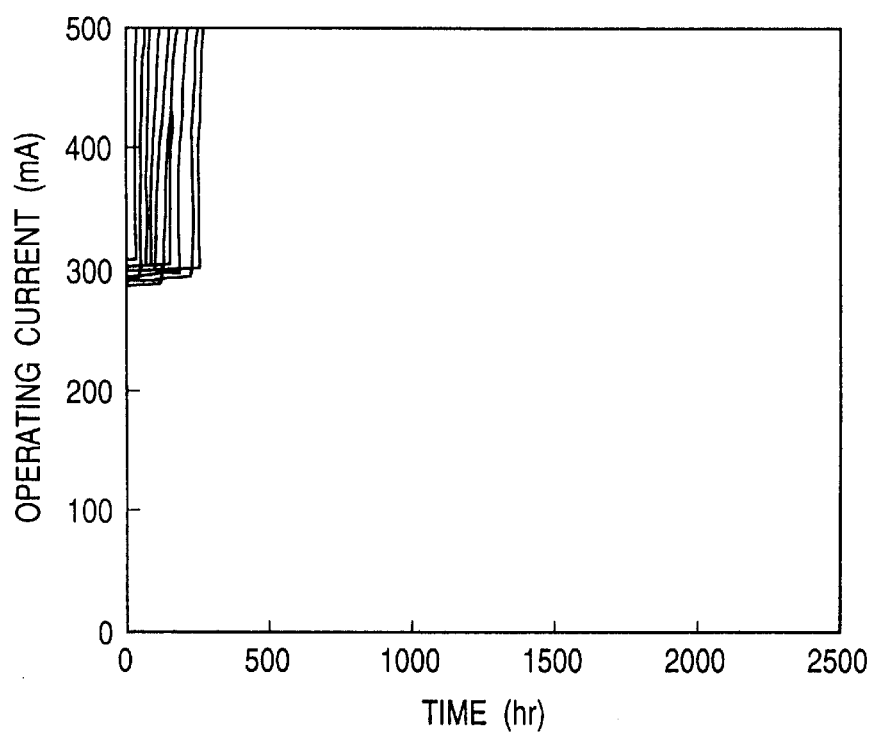
FIG. 6 shows the results of the life test (200 mW, output, 50° C., in APC mode) on the semiconductor laser of Comparative Example 2 of the present invention.

The procedure of Example 1 was repeated but the stop of the Ar plasma irradiation, prior to the formation of the Si passivation layers on the front and rear facets, was omitted. The obtained devices showed a threshold current of 23 mA at 25° C. and kink was observed at 350 mA, 250 mW as the average initial characteristics, similar to Example 1. When 10 devices were subjected to a life test of APC mod (200 mW, 50° C.) , all of the samples underwent sudden failure within 250 hours, am shown in FIG. 6. Both Ga—O and AS—O are detected when the facets are subjected to XPS measurement with the detection angle of photo-electron of 75°.

Further, one of the elements thus formed is processed into a sample for transmission electron microscopic observation and the active layer in the vicinities of the facets are compared with bulks. As a results the vicinities of the facets look almost the same as the bulks.

It is confirmed that the band gap in the vicinities of the facet is the same an those of InGaAs quantum well or GaAs bulk in the laser diode when measured by electron energy-loss spectroscopy.

COMPARATIVE EXAMPLE 3

Figure 7:
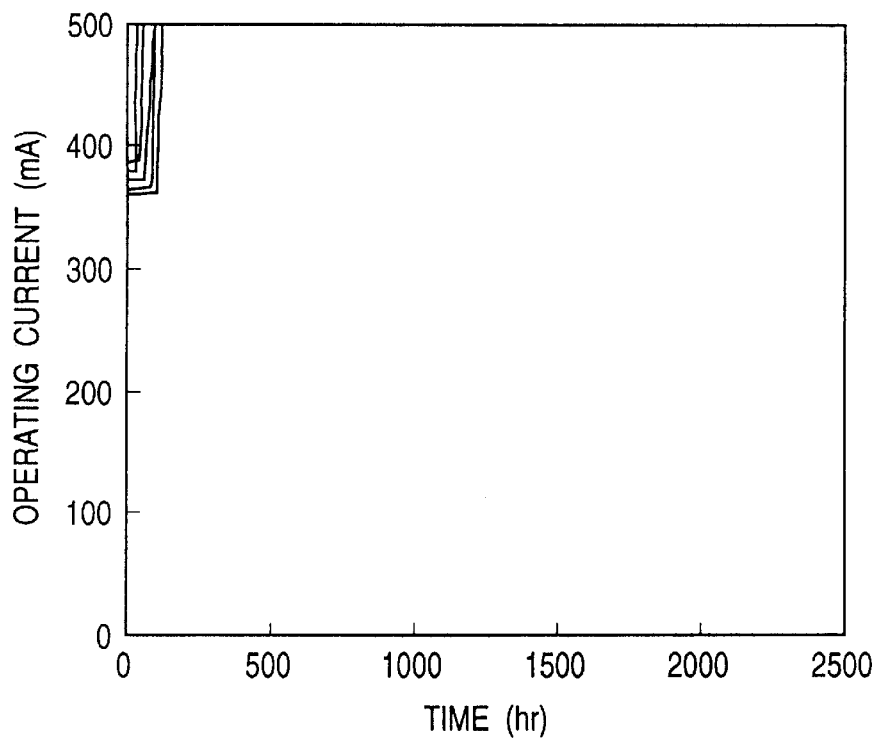
FIG. 7 shown the results of the life test (200 mW, output, 50° C., in APC mode) on the semiconductor laser of Comparative Example 3 of the present invention.

The procedure of Example 2 was repeated but the step of the formation of the Si passivation layers on the front and rear facets and the previous step of the Ar plasma irradiation were omitted. When five devices thus obtained were subjected to a life test of APC mode (200 mV, 50° C.), all of the samples underwent sudden failure within 100 hours, as shown in FIG. 7.

Both Ga—O and As—O are detected when the facets are subjected to XPS measurement with the detection angle of photo-electron of 75°.

Further, one of the elements thus formed is processed into a sample for transmission electron microscopic observation and the active layer in the vicinities of the facets are compared,with bulks. As a result, the vicinities of the facets look almost the same as the bulks.

It is confirmed that the band gap in the vicinities of the facet is the some an those of InGaAs quantum well or GaAs bulk in the laser diode when measured by electron energy-loss spectroscopy.

EXAMPLE 3

Now the third example of the present invention will be described.

Characteristics in this example is that the conduction type of active layer is p-type.

Laser bars were produced by the same method as the one described in Example 1 except that the active layer (4) grown on the first conduction type of clad layer (3) is consisting of an n-GaAs optical guide layer having a thickness of 24 nm and a carrier density of $5 \times 10^{16}$ cm$^{-3}$; an p-In$_{0.2}$Ga$_{0.6}$As single quantum well (SQW) having a thickness of 6 nm and a carrier density of $5 \times 10^{16}$ cm$^{-3}$; and a p-GaAs optical guide layer having a thickness of 24 nm and a carrier density of $5 \times 10^{16}$ cm$^{-3}$.

Then the facets of the laser bars were treated in the same manner as employed in Example 1 except that the average energy of the Ar plasma applied before the formation of Si passivation layer was 90 eV and that the coating layer formed on both facets was a single layer of AlO$_x$ having a thickness of 2 nm. As a result, the reflectance at the both facets was 32% at an emission wavelength of 980 nm.

Figure 8:
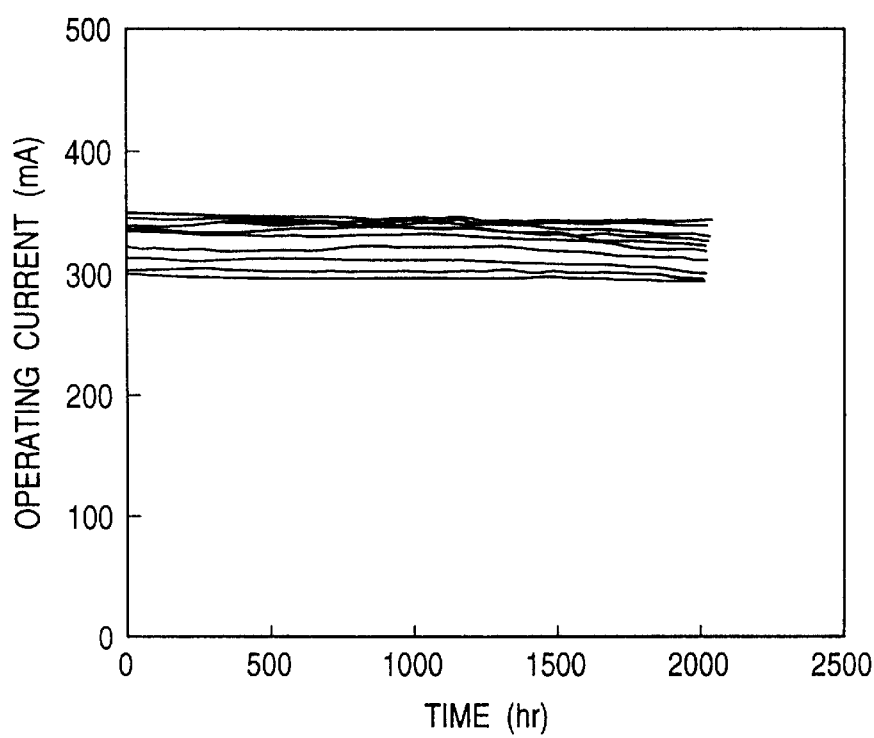
FIG. 8 shows the results of the life test (100 mW, output, 50° C., in APC mode) on the semiconductor laser of Example 3 of the present invention.

From these laser bars, 10 devices were put onto a heat sink and packaged in a nitrogen atmosphere. These devices showed a threshold current of 22 mA at 25° C. as the average initial characteristics. The optical output from one facet was controlled to a constant output (100 mW) and a life test of APC (Automatic Power Control) mode was carried out at 50° C. As a result, no sudden failure was observed within 2,000 hours, as shown in FIG. 8, indicating stable driving.

One of these laser bars was subjected to XPS measurement as a sample for analyzing the facets. In this step, the detection angle of photo-electron was set to 75° and the conditions of the semiconductor laser facets were observed. As a result, neither Ga—O nor As—O was detected.

Further, one of the elements thus formed is processed into a sample for transmission electron microscopic observation and the active layer in the vicinities of the facets are compared with bulks. As a result, it in confirmed that the vicinities of the facets irradiated with the Ar plasma show damaged crystallinity, i.e., disordering.

When measured by electron energy-loss spectroscopy, it is confirmed that the band gap in the vicinities of the facet in broadened and that the facet is transparent to the emission wavelength.

EXAMPLE 4

Laser bars wore produced by the came method an the one described in Example 3 but altering the procedure for forming the coating layer on the rear facet as follows. Then the front and rear facets were processed. Namely, an $AlO_x$ film of 165 nm in thickness was formed on the front facet so as to give a refractive index of 2.5%, while four continuous layers consisting of an $AlO_x$ film (170 nm)/an amorphous Si layer (60 nm)/an $AlO_x$ film (170 nm)/an amorphous Si layer (60 nm) were formed on the roar facet, by the IAD method for $AlO_x$ film and by electron beam evaporation for Si layer respectively.

Figure 9:
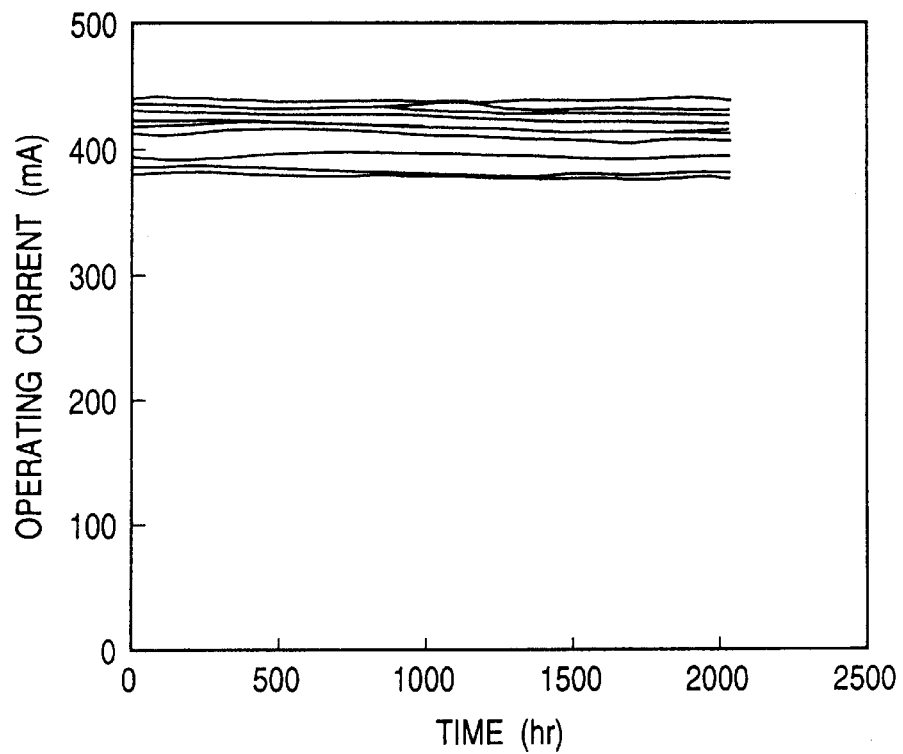
FIG. 9 shows the results of the life test (250 mW, output, 50° C., in APC mode) on the semiconductor laser of example 4 of the present invention.

From these loser bars, 10 devices were put onto a heat sink(submount) and packaged in a nitrogen atmosphere. These devices showed a threshold current of 22 mA at 25° C. and kink was observed at 370 mA, 265 mW as the average initial characteristics. These samples were subjected to an accelerated life test of APC mode at a constant level (250 mW) at 50° C. As a result, no sudden failure was observed within 2,000 hours, as shown in FIG. 9, indicating stable driving.

Neither Ga—O nor As—O is detected when such treated facets are subjected to XPS measurement with the detection angle of photo-electron of 75°.

Further, one of the elements thus formed is processed into a sample for transmission electron microscopic observation and the active layer in the vicinities of the facets were compared with bulks. As a result, it is confirmed that the vicinities of the facets irradiated with the Ar plasma show damaged crystallinity, i.e., disordering.

When measured by electron energy-loss spectroscopy, it is confirmed that the band gap in the vicinities of the facet is broadened and that the facet is transparent to the emission wavelength.

COMPARATIVE EXAMPLE 4

The same treatments as those described in Example 3 were performed but no Ar plasma irradiation was effected.

Figure 10:
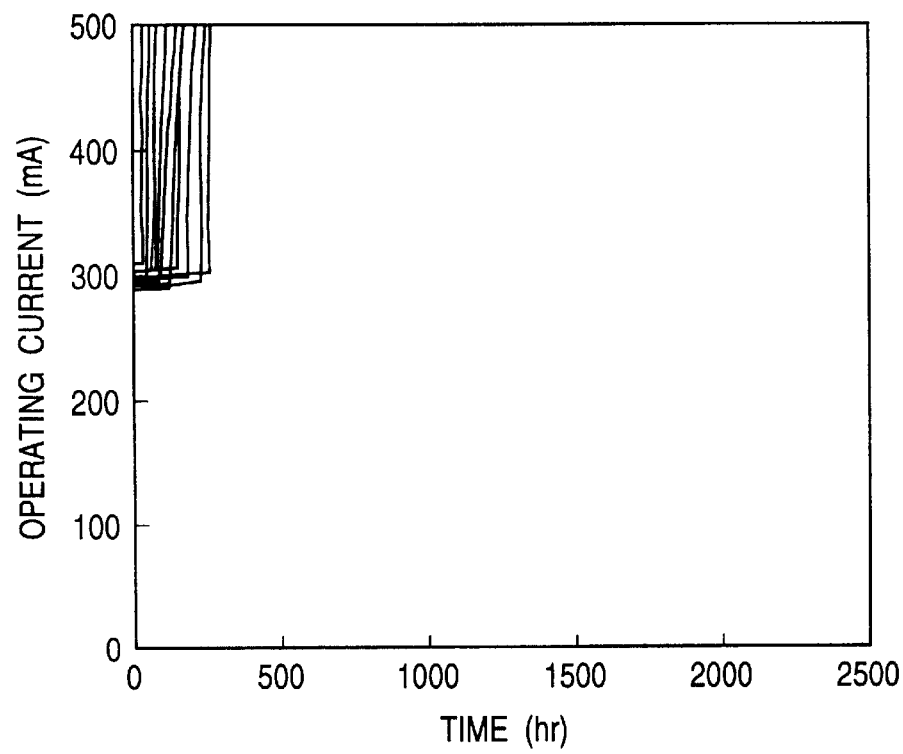
FIG. 10 shows the results of the life test (100 mW, output, 50° C., in APC mode) on the semiconductor laser of comparative Example 4 of the present invention.

From these laser bars, 10 devices were put onto a heat sink and packaged in a nitrogen atmosphere. These devices showed a threshold current of 22 mA at 25° C. as the average initial characteristics, showing no difference from the data of Example 3. The optical output from one facet was controlled to a constant level (100 mW) and a life test of APC mods was carried out at 50° C. As a result, all devices were damaged within 250 hours as shown in FIG. 10.

Both Ga—O and AS—O are detected when the facets are subjected to XPS measurement with the detection angle of photo-electron of 75°.

Further, one of the elements thus formed is processed into a sample for transmission electron microscopic observation and the active layer in the vicinities of the facets are compared with bulks. As a result, the vicinities of the facets look almost the same as the bulks.

It is confirmed that the band gap in the vicinities of the facet is the same as those of InGaAs quantum well or GaAs bulk in the laser diode when measured by electron energy-loss spectroscopy.

EXAMPLE 5

Now the fifth example of the present invention will be illustrated.

Characteristics in this example reside in that the facets forming the cavity and being opposite to each other were irradiated with plasma having energy of from 25 eV to 300 eV.

Thus this example realizes a compound semiconductor light emitting device with improvement reliability even when the facets are not covered with passivation layers.

Similar to the Examples 3 and 4 described above, a compound semiconductor layer structure was first formed by epitaxial growth. Although the active layers in Example 3 were those having a single quantum well structure of p-type quantum well layers, undoped active layer having a double quantum well structure were employed herein. That is to say, epitaxial growth layers were formed by the same method as those employed in Examples 3 and 4 but using active layers consisting of an undoped GaAs optical guide layer (24 nm), an undoped $In_{0.2}Ga_{0.8}As$ quantum well layer (6 nm), an undoped GaAs barrier layer (10 nm), an undoped $In_{0.2}Ga_{0.8}As$ quantum well layer (6 nm), and an undoped GaAs optical guide layer (24 nm) to give a wafer for forming a semiconductor laser.

Figure 11:
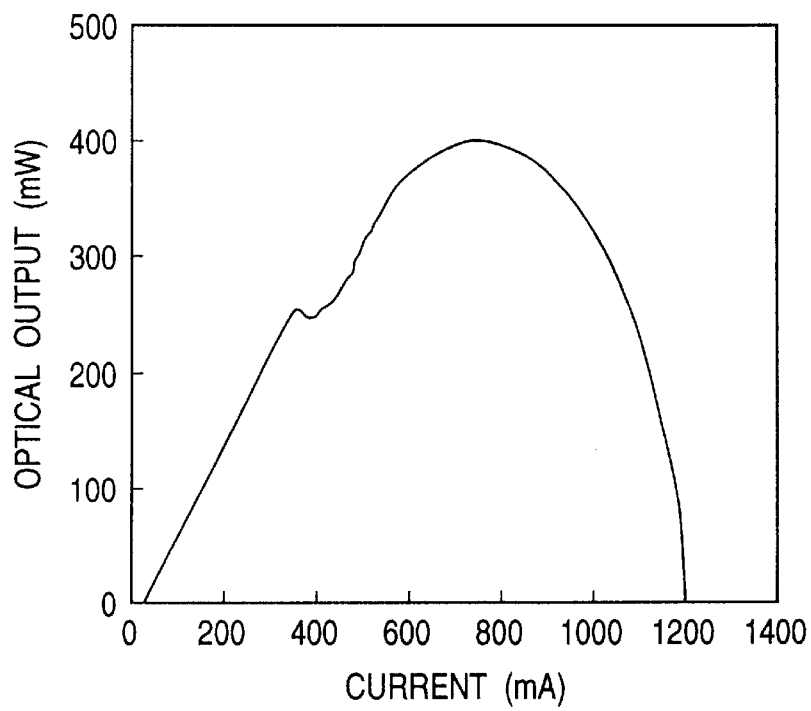
FIG. 11 is a graph showing the current VS optical output characteristics of the semiconductor laser of Example 5 of the present invention.
Figure 12:
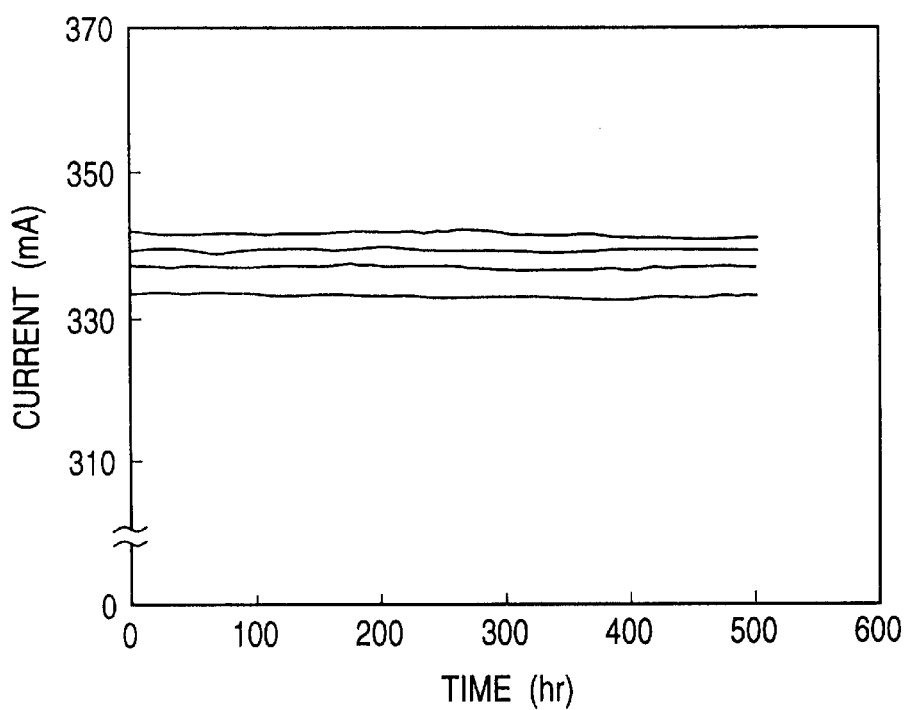
FIG. 12 is a graph showing the results of the life test (200 mW output, 70° C., in APC mode) on the semiconductor laser of Example 5 of the present invention.

After forming electrodes, the wafer was cleaved into laser bare. Next, both facets were irradiated from the sides of the facets, with Ar plasma of 100 eV in average energy and 20 $\mu A/cm^2$ in ion current density each for 3 minutes. Then a single $AlO_x$ layer was formed on the front facet as an anti-reflective coating layer (15) while four layers of $AlO_x$/amorphous Si/$AlO_x$/amorphous Si were formed on the rear facet as a high-reflective coating layer, thus affecting asymmetric coating of 5%/90% (refer to FIG. 1). FIG. 11 shows the initial current optical output characteristics of the element thus obtained. The threshold current at 25° C. was 21 mA. FIG. 12 shows the results of the life test (200 mW output, 70° C., in the APC mode).

As—O is not detected when such treated facets are subjected to XPS measurement with the detection angle of photo-electron of 75°.

Further, one of the elements thus formed is processed into a sample for transmission electron microscopic observation and the active layer in the vicinities of the facets are compared with bulks. As a result, it is confirmed that the vicinities of the facets irradiated with the Ar plasma show damaged crystallinity, i.e., disordering.

When measured by electron energy-loss spectroscopy, it is confirmed that the band gap in the vicinities of the facet is broadened and that the facet is transparent to the emission wavelength.

COMPARATIVE EXAMPLE 5

Figure 13:
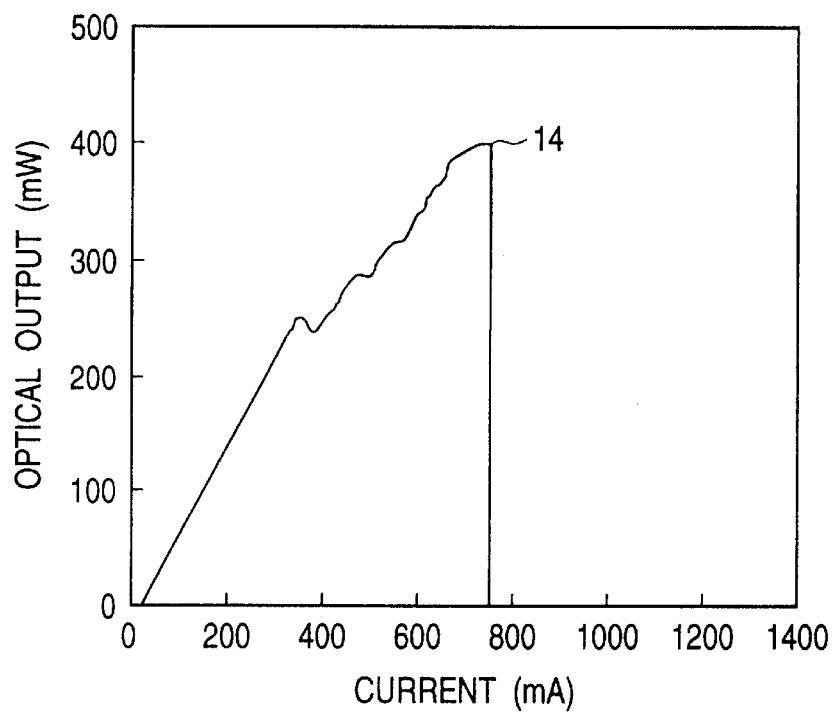
FIG. 13 is a graph showing the initial current VS optical output characteristics of the semiconductor laser of Comparative Example 5.
Figure 14:
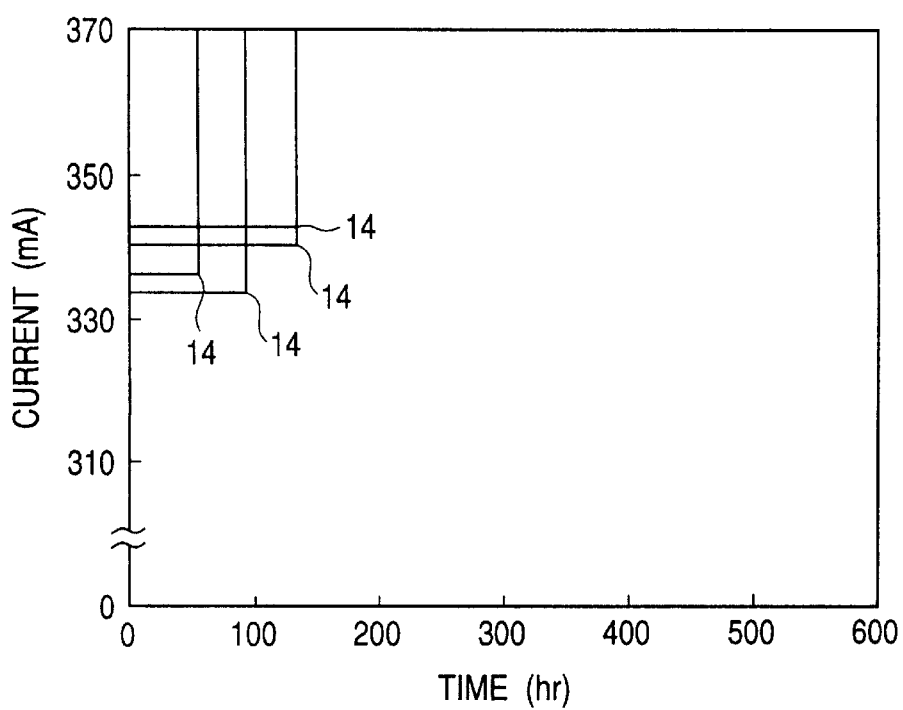
FIG. 14 is a graph showing the results of the life test (200 mW output, 70° C., in APC mode) on the semiconductor laser of Comparative Example 5.

The procedure of Example 5 was repeated but no Ar plasma irradiation was performed. FIG. 13 shows the initial current vs optical output characteristics of the element thus obtained. The threshold current at 25° C. was 21 mA. FIG. 14 shows the results of the life test (200 mW output, 70° C., in the APC mode). Both Ga—O and AS—O are detected when the facets are subjected to XPS measurement with the detection angle of photo-electron of 75°.

Further, one of the elements thus formed is processed into a sample for transmission electron microsopic observation and the active layer in the vicinities of the facets are compared with bulks. As a result, the vicinities of the facets look almost the same as the bulks.

It is confirmed that the band gap in the vicinities of the facet its the same as those of InGaAs quantum well or GaAs bulk in the laser diode when measured by electron energy-lose spectroscopy.

COMPARATIVE EXAMPLE 6

Figure 15:
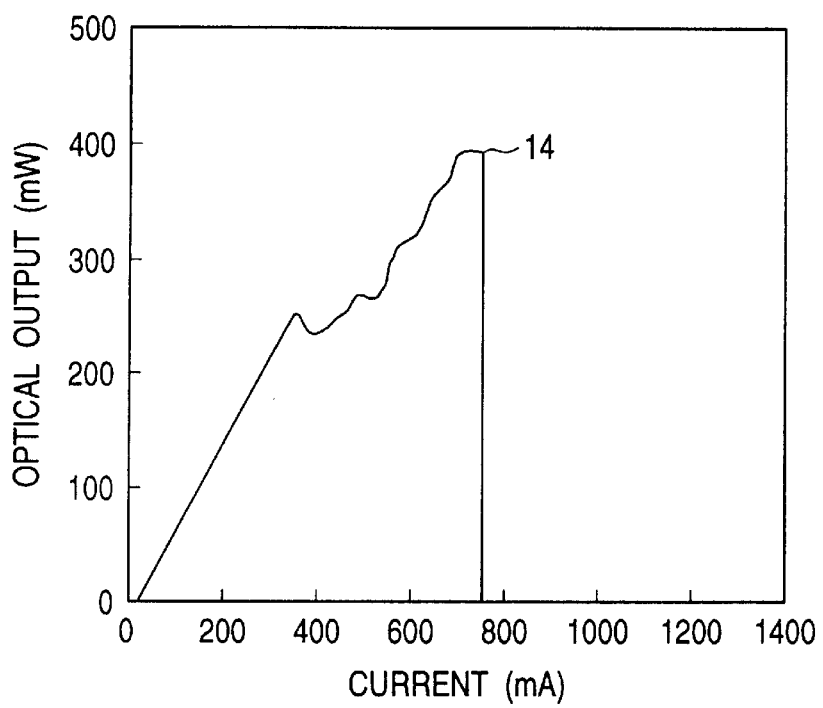
FIG. 15 is a graph showing the initial current VS optical output characteristics of the semiconductor laser of Comparative Example 6.
Figure 16:
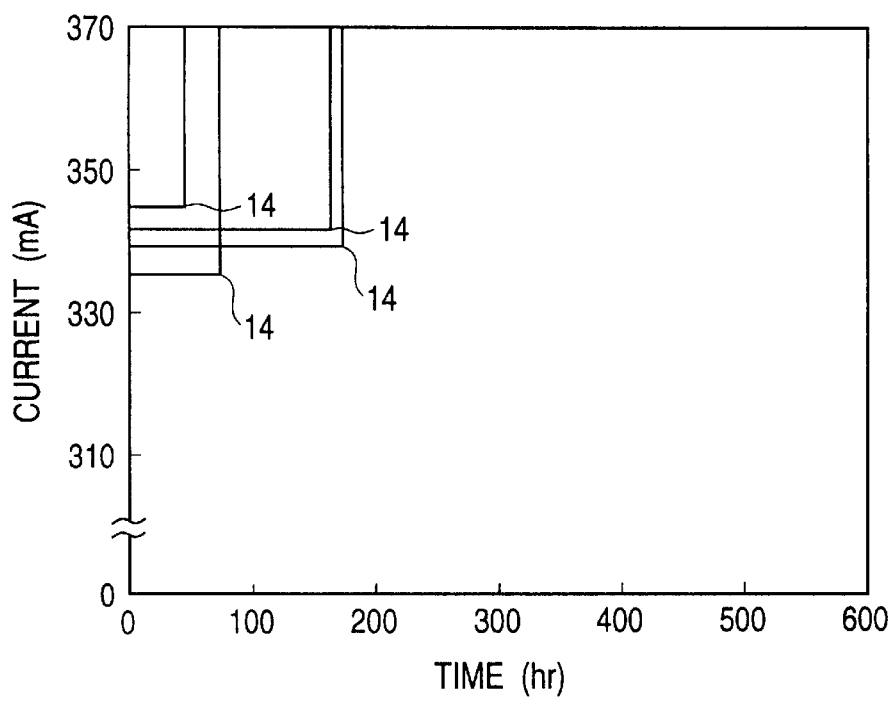
FIG. 16 is a graph showing the results of the life test (200 mW output, 70° C., in APC mode) on the semiconductor laser of Comparative Example 6.

The procedure of Example 5 was repeated but using Ar plasma of 20 eV in energy. FIG. 15 shows the initial current vs optical output characteristics of the element thus obtained. The threshold current at 25° C. was 21 mA. FIG.

16 shows the results of the life test (200 mW output, 70° C., in the APC mode).

Both Ga—O and AS—O are detected when the facets are subjected to XPS measurement with the detection angle of photo-electron of 75°.

Further, one of the elements thus formed is processed into a sample for transmission electron microsopic observation and the active layer in the vicinities of the facets are compared with bulks. As a result, the vicinities of the facets look almost the same as the bulks.

It is confirmed that the band gap in the vicinities of the facet is the same as those of InGaAs quantum well or GaAs bulk in the laser diode when measured by electron energy-loss spectroscopy.

COMPARATIVE EXAMPLE 7

Figure 17:
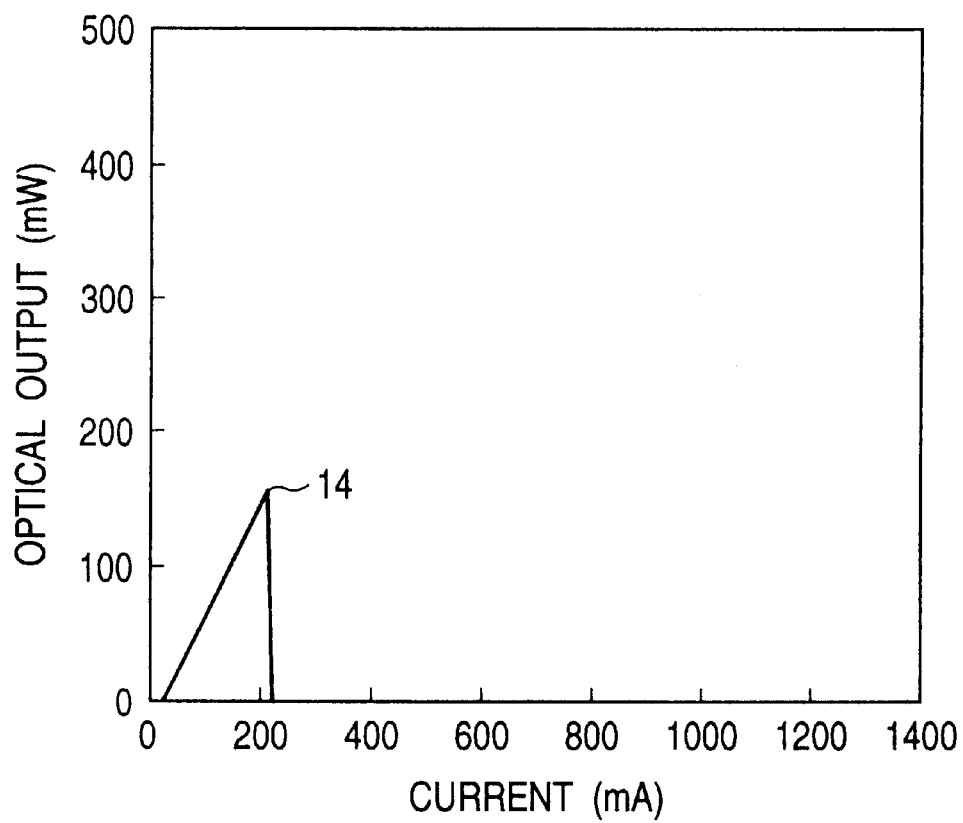
FIG. 17 is a graph showing the initial current VS optical output characteristics of the semiconductor laser of Comparative Example 7.

The procedure of Example 5 was repeated but using Ar plasma of 600 eV in energy. FIG. 17 shows the initial current vs optical output characteristics of the element thus obtained. The threshold current at 25° C. was 23 mA. As FIG. 17 shows, no life test could be performed since the initial output of 200 mW could not be established.

EXAMPLE 6

Now the sixth example of the present invention will be illustrated.

Characteristics in this example reside in that, a part of the constituting elements of the active layer in the vicinities of the facet was eliminated before passivation layers were formed in vacuum (refer to FIGS. 1 and 2).

Epitaxial growth layers were formed in the same manner as those of Example 1, except that the active layer was consisting of an undoped GaAs optical guide layer (30 nm)/undoped $In_{0.2}Ga_{0.8}As$ quantum well layer (6 nm) /an undoped GaAs optical guide layer (30 nm) to thereby give a wafer for forming semiconductor lasers.

The wafer for semiconductor lasers was formed in the same means as those described in the above Example 1.

Next, this wafer was cleaved into laser bars of 700 μm in cavity length and these laser bars were put into a vacuum chamber with an ion-gun to generate Ar plasma. Then the front facet was first irradiated from the side of this facet with heat beam and light by using a halogen lamp (4.5 KW) for 3 minutes. In this step, the laser bar facet temperature was about 550° C. Further, amorphous Si was deposited (2 nm) on the facet and an $AlO_x$ film of 165 nm in thickness was formed thereafter so that the reflectance of the front facet at emission wavelength of 980 nm became 2.5%. In the step of the $AlO_x$ film formation, Ar plasma having average energy of 120 eV and current density of 200 $\mu A/cm^2$ and source of $AlO_x$ were supplied to the facet at the same time (IAD method).

Subsequently, the laser bars were once taken out from the vacuum chamber to treat the rear facet. Then the rear facet was treated by irradiating from the side of the facet with heat beam and light by using a halogen lamp (4.5 KW) for 3 minutes, Further, amorphous Si was deposited (2 nm) on the facet and four continuous layers consisting of $AlO_x$ film (170 nm) /amorphous Si (60 nm)/$AlO_x$ film (170 nm)/amorphous Si (60 nm) were formed to give a rear facet having reflectance of 92%.

Figure 18:
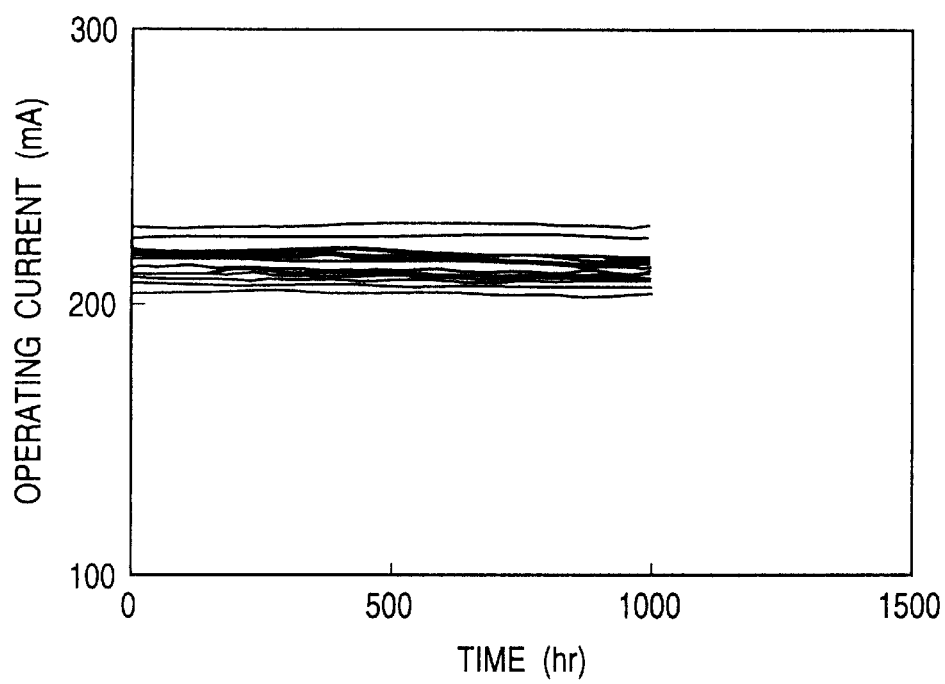
FIG. 18 is a graph showing the results of the life test (150 mW output, 70° C., in APC mode) on the semiconductor laser of Example 6 of the present invention.

From these laser bars, 10 devices were put onto a heat sink and packaged in a nitrogen atmosphere. These devices showed a threshold current of 21 mA at 25° C. and kink was observed at 350 mA, 250 mW as the average initial characteristics, The emission wavelength of these devices was 980 nm. When subjected to an accelerated life test of APC mode (150 mW, 50° C.), these samples showed no sudden failure within 1,000 hours, as shown in FIG. 18, indicating stable driving.

Neither Ga—O nor As—O is detected when such treated facets are subjected to XPS measurement with the detection angle of photo-electron of 75°. Ga—O and As—O exist on the GaAs (100)face once exposed to the atmosphere.

One device is taken out from these laser bars as a sample for analysis. After removing the $AlO_x$ layer and Si layer at the front facet by using a hydrofluoric acid-based etchant, the device is introduced into an apparatus for vacuum analysis and the band gap in the vicinities of the front facet of the active layer is measured by the electron energy-loss spectroscopy. This electron energy-loss spectroscopy, by which the information exclusively in the vicinities of the sample surface (the maximum analytical depth: about 1.5 nm) can be obtained, is a useful means for measuring the band gap in the vicinities of the laser facet without being affected by the physical values of the bulk region. The vicinities of the active layers of laser facets are irradiated with electron beam (been diameter:100 nm, power;,1000 eV). Then analysis is made on the diffraction energy of loss electron below the surface oxidation layer at a depth of 1 nm. Thus it is found out that the band gap at the InGaAs active layer facet is 1.45 eV due to the loss peak caused by band to band transition. The energy gap between quantum levels in the InGaAs quantum well active layer at room temperature, determined by measuring the photoluminescence, is 1.29 eV. Thus it is confirmed that the band gap in the vicinities of the facet is broadened mainly by the elimination of InAs in the active layer and the facet is transparent to the emission wavelength.

EXAMPLE 7

A wafer of the same structure as that of Example 6 was employed but the laser facets were treated in the following manner.

Next, this wafer was cleaved in the atmosphere into laser bars of 700 μm in cavity length and these laser bars were put into a vacuum chamber provided with an ion-gun to generate Ar plasma. Then the front facet was first irradiated from the side of the facet with heat beam and light by using a halogen lamp (4.5 KW) for 3 minutes. In this step, the laser bar facet temperature was about 550° C. Further, amorphous Si was deposited (3 nm) on the facet and an $AlO_x$ film of 165 nm in thickness was formed thereafter so that the reflectance of the front facet of the anti-reflective coating layer (15) at emission wavelength of 980 nm became 2.5%. In the step of the $AlO_x$ film formation, Ar plasma having average energy of 150 eV and current density of 200 $\mu A/cm^2$ and source of $AlO_x$ were supplied to the facet at the same time(IAD method).

Subsequently, the laser bars were once taken out from the vacuum chamber to treat the rear facet. Then the rear facet was treated by irradiating from the side of the facet with heat beam and light by using a halogen lamp (4.5 KW) for 3 minutes. Further, amorphous Si was deposited (3 nm) on the facet and six continuous layers consisting of $SiO_x$ film (200 nm)/$TiO_x$ (120)/$SiO_x$ (200 nm)/$TiO_x$ (120 nm)/$SiO_x$ (200 nm)/$TiO_x$ (120 nm) were formed to give a rear facet high-reflective coating layer (16) having reflectance of 88%.

Figure 19:
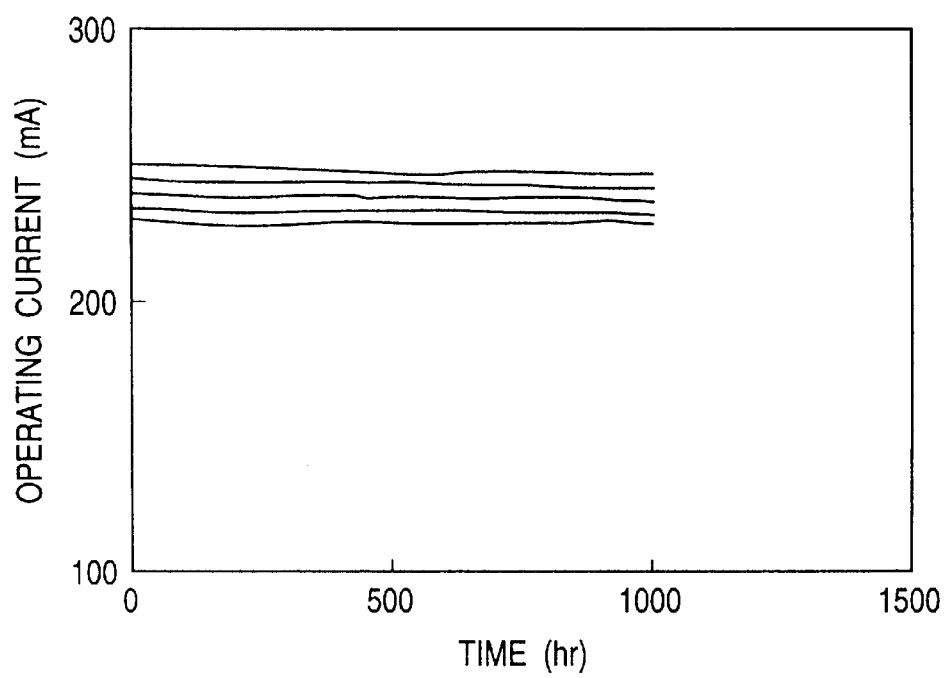
FIG. 19 in a graph showing the results of the life test (150 mW output 70° C., in APC mode) on the semiconductor laser of Example 7 of the present invention.

From these laser bars, five devices were put onto a heat sink and packaged in a nitrogen atmosphere, These devices showed a threshold current of 23 mA at 25° C. and kink was observed at 350 mA, 250 mW as the average initial characteristics. The emission wavelength of these devices was 980 nm. When subjected to an accelerated life test of APC mode (150 mW, 70° C.), these samples showed no sudden failure within 1,000 hours, as shown in FIG. 19, indicating stable driving.

Similar to Example 6, the band gap in the vicinities of the facet of the active layer is measured by the electron energy-loss spectroscopy. As a result, it is found out that the band gap at the InGaAs active layer facet is 1.45 eV. The energy gap between quantum levels in the InGaAs quantum well active layer at room temperature, determined by measuring the photoluminescence, is 1.29 eV. Thus it is confirmed that the band gap in the vicinities of the facet was broadened mainly by the elimination of InAs in the facet of the active layer and the facet is transparent to the mission wavelength.

Neither Ga—O nor As—O is detected when much treated facets are subjected to XPS measurement with the detection angle of photo-electron of 75°.

COMPARATIVE EXAMPLE 8

Figure 20:
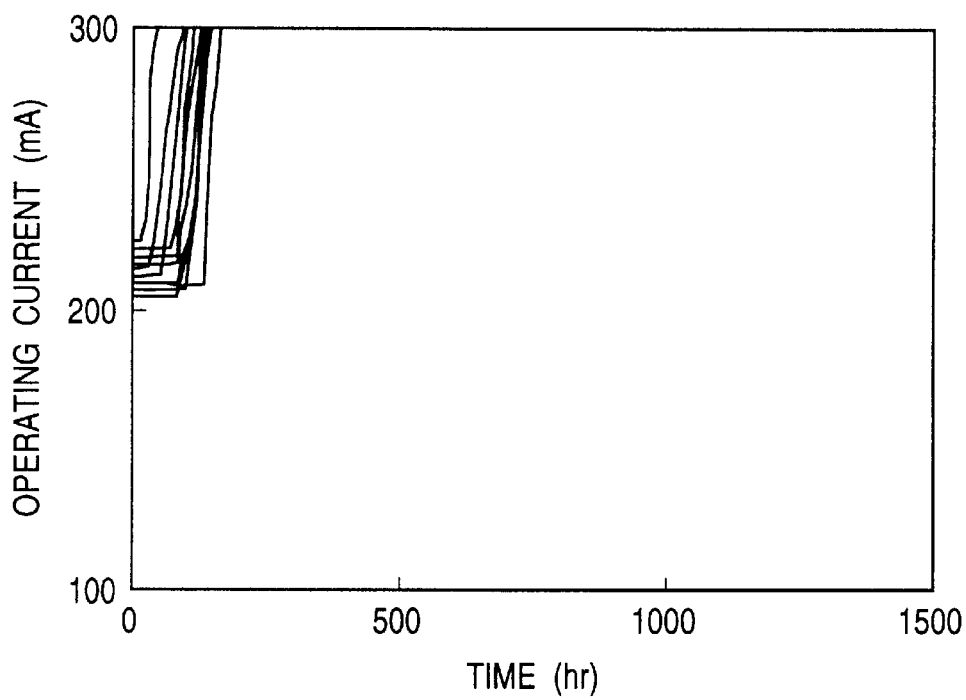
FIG. 20 shows the results of the life test (150 mW output, 70° C., in APC mode) on the semiconductor laser of Comparative example 8 of the present invention.

The procedure of Example 6 was repeated but the step of the formation of the Si passivation layers on the front and rear facets, and the previous step of selectively exposing the facets to heat beam and light thereby making the facet transparent were omitted and the coating layers were formed not by the IAD method but by the conventional electron beam evaporation method. The obtained devices showed a threshold current of 21 mA at 25° C. and kink was observed at 350 mA, 250 mW as the average initial characteristics, similar to Example 6. When 10 devices were subjected to a life test of APC mode (150 mW, 70° C.), all of the samples underwent sudden failure within 150 hours, as shown in FIG. 20.

Both Ga—O and AS—O are detected when the facets are subjected to XPS measurement with the detection angle of photo-electron of 75°.

It is confirmed that the band gap in the vicinities of the facet is the same as those of InGaAS quantum well or GaAs bulk in the laser diode when measured by electron energy-loss spectroscopy.

COMPARATIVE EXAMPLE 9

Figure 21:
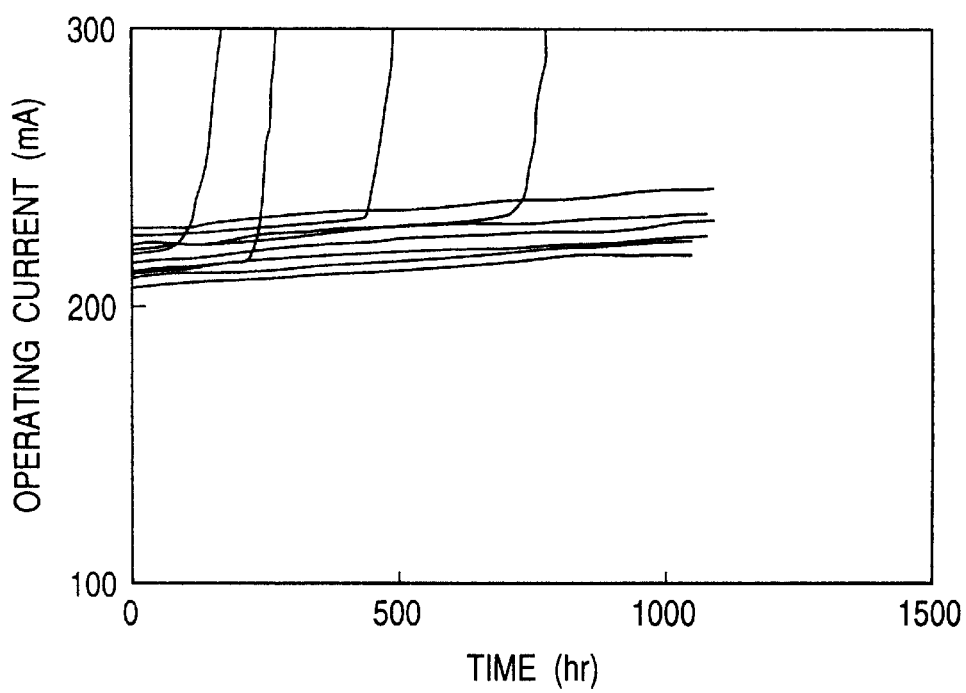
FIG. 21 shows the results of the life test (150 mW output, 70° C., in APC mode) on the semiconductor laser of Comparative example 9 of the present invention.

The procedure of Example 6 was repeated but the step of the formation of the Si passivation layers on the front and rear facets was omitted and the coating layers were formed not by the IAD method but by the conventional electron beam evaporation method. The obtained devices showed a threshold current of 21 mA at 25° C. and kink was observed at 350 mA, 250 mW as the average initial characteristics, similar to Example 6. When 10 devices were subjected to a life test of APC mode (150 mW, 70° C.), four samples underwent sudden failure within 1000 hours, as shown in FIG. 21. Moreover, those devices showed a somewhat higher degradation rate than those in Example 6.

As—O is not detected when such treated facets are subjected to XPS measurement with the detection angle of photo-electron of 75°.

COMPARATIVE EXAMPLE 10

Figure 22:
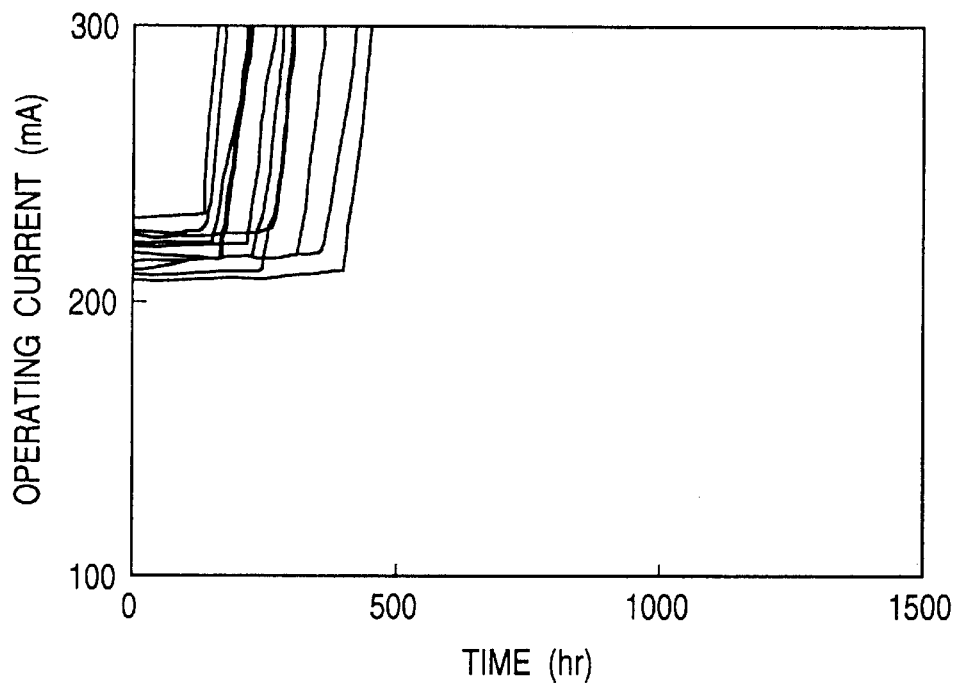
FIG. 22 shows the results of the life test (150 mW output, 70° C., in APC mode) on the semiconductor laser of Comparative Example 10.

The procedure of Example 6 was repeated but the step of selectively exposing the facets to heat beam and light thereby making the facet transparent, prior to the formation of the Si passivation layers on the front and rear facets, were omitted, and the coating layers were formed not by IAD method but by conventional electron beam evaporation method. The obtained devices showed a threshold current of 21 mA at 25° C. and kink was observed at 350 mA, 250 mW as the average initial characteristics, similar to Example 6. When 10 devices were subjected to a life test of APC mode (150 mW, 70° C.), all of the samples underwent sudden failure within 400 hours, as shown in FIG. 22. Both Ga—O and AS—O are detected when the facets are subjected to XPS measurement with the detection angle of photo-electron of 75°.

It is confirmed that the band gap in the vicinities of the facet is the same as those of InGaAs quantum well or GaAs bulk in the laser diode when measured by electron energy-loss spectroscopy.

COMPARATIVE EXAMPLE 11

Figure 23:
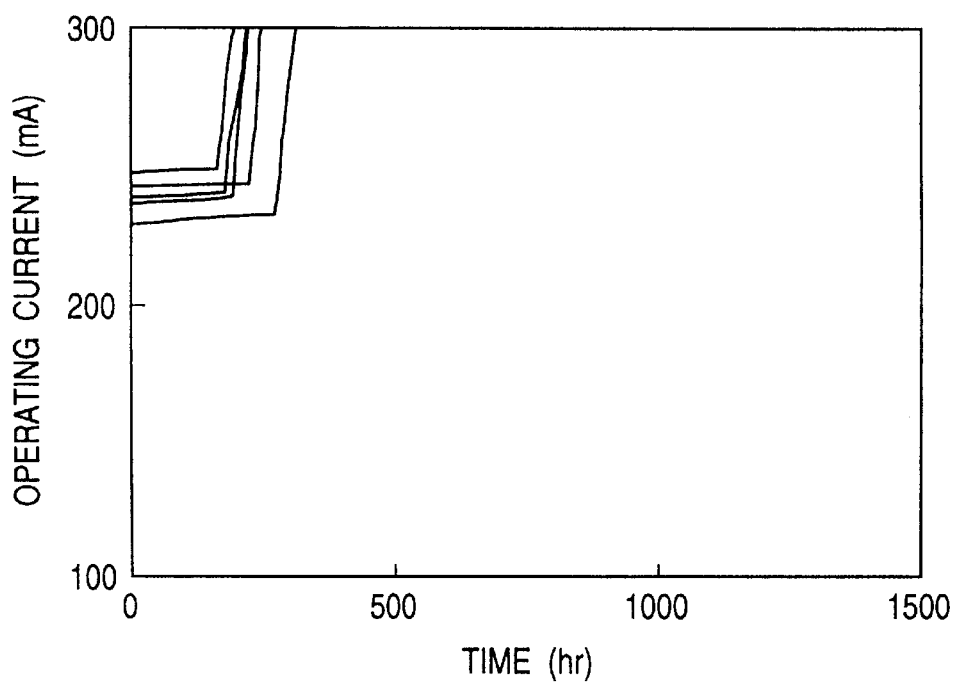
FIG. 23 shows the results of the life test (150 mW output, 70° C., in APC mode) on the semiconductor laser of Comparative Example 11.

The procedure of Example 7 was repeated but the step of the formation of the Si passivation layers on the front and rear facets, and the previous step of selectively exposing the facets to heat beam and light thereby making the facet transparent were omitted. further, the coating layers were formed not by the IAD method but by the conventional electron beam evaporation method. The band gap of the InGaAs quantum well active layer measured by the electron energy-loss spectroscopy is 1.28 eV which is almost the same as the value in the bulk region determined by PL. When 10 devices thus obtained were subjected to a life test of APC mode (150 mW, 70° C.), all of the samples underwent sudden failure within 250 hours, as shown in FIG. 23. Both Ga—O and AS—O are detected when the facets are subjected to XPS measurement with the detection angle of photo-electron of 75°.

It is confirmed that the band gap in the vicinities of the facet is the same as those of InGAs quantum well or GaAs bulk in the laser diode when measured by electron energy-loss spectroscopy.

What is claimed is:

1. A method of fabricating a compound semiconductor light emitting device, comprising the steps of:
    growing a first conduction type of clad layer on a substrate;
    forming facets of a cavity; and
    irradiating said facets of the cavity with plasma of an element of the group 18 having energy of from 25 eV to 300 eV in vacuum so as to obtain said facets free from oxygen.

2. The method of fabricating a compound semiconductor light emitting device as claimed in claim 1, wherein said step of forming facets of a cavity comprises a cleavage of the first conduction type of clad layer, the active layer and the second conduction type of clad layer so that two facets are opposite to each other to form the cavity.

3. The method of fabricating a compound semiconductor light emitting device as claimed in claim 1, wherein said step of irradiating uses argon plasma.

4. The method of fabricating a compound semiconductor light emitting device as claimed in claim 1, further comprising a step of:
    forming a passivation layer on each facet after said plasma irradiation step.

5. The method of fabricating a compound semiconductor light emitting device as claimed in claim 1, further comprising a step of:
    forming an anti-reflective coating and/or a high reflective coating on said facets without breaking a vacuum after the irradiating step.

6. A method of fabricating a compound semiconductor light emitting device, comprising the steps of:

growing a first conduction type of clad layer, an active layer and a second conduction type of clad layer on a substrate;

forming facets of a cavity by cleavage of the first conduction type of clad layer, the active layer and the second conduction type of clad layer so that two facets are opposite to each other so as to form a cavity;

removing, from said facets, a part of elements constituting the facets by irradiating said facets with at least one member selected from the group consisting of ion, electron, light and heat in vacuum; and forming a passivation layer on each facet after said removing step.

7. The method of fabricating a compound semiconductor light emitting device as claimed in claim 6, wherein said step of irradiating uses argon plasma.

8. The method of fabricating a compound semiconductor light emitting device an claimed in claim 6, wherein plasma having energy of from 25 eV to 300 eV is used in said irradiating step.

9. The method of fabricating a compound semiconductor light emitting device as claimed in claim 6, wherein plasma of an element of the group 18 is used in said irradiating step.

10. The method of fabricating a compound semiconductor light emitting device as claimed in claim 6, further comprising a step of forming, on said passivation layer, a coating layer containing at least one material selected from the group consisting of dielectrics and combinations of dielectrics and semiconductors.

11. The method of fabricating a compound semiconductor light emitting device as claimed in claim 6, wherein said passivation layer contains Si.

12. The method of fabricating a compound semiconductor light emitting device as claimed in claim 10, wherein, at the formation of said coating layer, the surface is irradiated with plasma simultaneously with the formation of the coating layer.

13. The method of fabricating a compound semiconductor light emitting device as claimed in claim 1, wherein said irradiating step is a step of irradiating said facet of the cavity with a current density in a range of 1 $\mu A/cm^2$ to 1 $mA/cm^2$.

14. The method of fabricating a compound semiconductor light emitting device as claimed in claim 1, wherein said forming step is a step of forming facets of a cavity by cleaving under atomospheric pressure.

15. The method of fabricating a compound semiconductor light emitting device as claimed in claim 6, wherein, said forming step is a step of forming facets of a cavity by cleaving under atomospheric pressure.

16. The method of fabricating a compound semiconductor light emitting device as claimed in claim 1, wherein said step of irradiating comprises a step of irradiating said facets of the cavity with plasma of an element of group 18 having energy from 25 eV to 100 eV in vacuum so as to obtain said facets free from oxygen.

17. The method of fabricating a compound semiconductor light emitting device as claimed in claim 8, wherein plasma having an energy of from 25 eV to 100 eV is used in said irradiating step.

* * * * *